US008945970B2

(12) United States Patent
Carley

(10) Patent No.: US 8,945,970 B2
(45) Date of Patent: Feb. 3, 2015

(54) ASSEMBLING AND APPLYING NANO-ELECTRO-MECHANICAL SYSTEMS

(75) Inventor: L. Richard Carley, Sewickley, PA (US)

(73) Assignee: Carnegie Mellon University, Pittsburgh, PA (US)

( * ) Notice: Subject to any disclaimer, the term of this patent is extended or adjusted under 35 U.S.C. 154(b) by 1131 days.

(21) Appl. No.: 12/442,269

(22) PCT Filed: Sep. 21, 2007

(86) PCT No.: PCT/US2007/020490
§ 371 (c)(1),
(2), (4) Date: Nov. 9, 2009

(87) PCT Pub. No.: WO2008/039372
PCT Pub. Date: Apr. 3, 2008

(65) Prior Publication Data
US 2010/0061143 A1 Mar. 11, 2010

Related U.S. Application Data

(60) Provisional application No. 60/846,691, filed on Sep. 22, 2006.

(51) Int. Cl.
*H01L 21/00* (2006.01)
*B81C 1/00* (2006.01)

(52) U.S. Cl.
CPC ..... *B81C 1/00198* (2013.01); *B81B 2201/0235* (2013.01)
USPC .................................. 438/52; 438/53; 438/55

(58) Field of Classification Search
USPC .................................. 333/262; 438/52, 53, 55
See application file for complete search history.

(56) References Cited

U.S. PATENT DOCUMENTS

| 6,477,028 | B1 * | 11/2002 | Pinto | 361/233 |
| 6,536,280 | B1 * | 3/2003 | Carley | 73/504.02 |
| 6,574,130 | B2 * | 6/2003 | Segal et al. | 365/129 |
| 6,706,402 | B2 * | 3/2004 | Rueckes et al. | 428/408 |
| 6,784,028 | B2 * | 8/2004 | Rueckes et al. | 438/128 |
| 6,819,820 | B1 * | 11/2004 | Chaparala et al. | 385/17 |
| 6,835,591 | B2 * | 12/2004 | Rueckes et al. | 438/99 |

(Continued)

FOREIGN PATENT DOCUMENTS

| EP | 1489639 | * 12/2004 | H01L 59/00 |
| EP | 1489639 A1 * | 12/2004 | H01H 59/00 |
| WO | WO 2008039372 A2 * | 4/2008 | B81C 1/00 |

OTHER PUBLICATIONS

International Search Report; PCT/US07/20490; Feb. 26, 2008.

(Continued)

*Primary Examiner* — Laura Menz
(74) *Attorney, Agent, or Firm* — Jones Day

(57) ABSTRACT

A method of constructing devices using semiconductor manufacturing processes includes fabricating a device having a movable portion and a fixed portion. The movable portion is connected to the fixed portion only through at least one sacrificial layer. The sacrificial layer is removed in the presence of a force of sufficient strength so as to controllably reposition the movable portion during the release process. The force can be externally applied, generated locally as a result of, for example, the relative positions of the fixed and movable portions, or some combination of the two. Several devices constructed according to such a method are also disclosed.

15 Claims, 21 Drawing Sheets

(56) References Cited

U.S. PATENT DOCUMENTS

| | | | |
|---|---|---|---|
| 6,836,424 B2 * | 12/2004 | Segal et al. | 365/129 |
| 6,882,256 B1 * | 4/2005 | Yip | 333/262 |
| 6,911,682 B2 * | 6/2005 | Rueckes et al. | 257/202 |
| 6,919,592 B2 * | 7/2005 | Segal et al. | 257/209 |
| 6,924,538 B2 * | 8/2005 | Jaiprakash et al. | 257/415 |
| 6,936,183 B2 * | 8/2005 | Chinn et al. | 216/90 |
| 6,942,921 B2 * | 9/2005 | Rueckes et al. | 428/408 |
| 6,979,590 B2 * | 12/2005 | Rueckes et al. | 438/99 |
| 6,990,009 B2 * | 1/2006 | Bertin et al. | 365/151 |
| 6,995,046 B2 * | 2/2006 | Rueckes et al. | 438/142 |
| 7,008,812 B1 * | 3/2006 | Carley | 438/52 |
| 7,034,332 B2 * | 4/2006 | Stasiak et al. | 257/40 |
| 7,045,421 B2 * | 5/2006 | Rueckes et al. | 438/257 |
| 7,056,758 B2 * | 6/2006 | Segal et al. | 438/50 |
| 7,071,023 B2 * | 7/2006 | Bertin et al. | 438/99 |
| 7,153,717 B2 * | 12/2006 | Carley et al. | 438/55 |
| 7,161,218 B2 * | 1/2007 | Bertin et al. | 257/415 |
| 7,434,476 B2 * | 10/2008 | Tang et al. | 73/777 |
| 7,471,439 B2 * | 12/2008 | Chen et al. | 359/290 |
| 7,538,474 B2 * | 5/2009 | Wong | 310/319 |
| 7,552,645 B2 * | 6/2009 | Bargatin et al. | 73/777 |
| 7,580,174 B2 * | 8/2009 | Chen et al. | 359/290 |
| 7,612,270 B1 * | 11/2009 | Zhu | 257/314 |
| 7,616,370 B2 * | 11/2009 | Chen et al. | 359/290 |
| 7,617,736 B2 * | 11/2009 | Tang et al. | 73/777 |
| 7,652,342 B2 * | 1/2010 | Bertin | 257/415 |
| 7,654,159 B2 * | 2/2010 | Enoksson et al. | 73/862.68 |
| 7,687,876 B2 * | 3/2010 | Kabir | 257/471 |
| 7,709,880 B2 * | 5/2010 | Bertin et al. | 257/314 |
| 7,812,410 B2 * | 10/2010 | Collonge et al. | 257/410 |
| 7,839,710 B2 * | 11/2010 | Kam et al. | 365/215 |
| 7,977,761 B2 * | 7/2011 | Kabir | 257/471 |
| 8,018,307 B2 * | 9/2011 | Van Beek et al. | 335/78 |
| 8,030,690 B2 * | 10/2011 | Ollier et al. | 257/254 |
| 8,125,039 B2 * | 2/2012 | Bertin et al. | 257/420 |
| 8,139,005 B2 * | 3/2012 | Kawase | 345/82 |
| 2002/0127760 A1 * | 9/2002 | Yeh et al. | 438/50 |
| 2003/0037874 A1 | 2/2003 | Liau et al. | |
| 2003/0141453 A1 | 7/2003 | Reed et al. | |
| 2003/0153116 A1 * | 8/2003 | Carley et al. | 438/53 |
| 2004/0042716 A1 | 3/2004 | Dames | |
| 2005/0062062 A1 * | 3/2005 | Bertin et al. | 257/200 |
| 2005/0068128 A1 * | 3/2005 | Yip | 333/262 |
| 2005/0260783 A1 * | 11/2005 | Lutz et al. | 438/51 |
| 2006/0130968 A1 | 6/2006 | Orii et al. | |
| 2006/0267167 A1 * | 11/2006 | McCain | 257/678 |
| 2007/0085963 A1 * | 4/2007 | Huang et al. | 349/152 |
| 2007/0121364 A1 * | 5/2007 | Bertin et al. | 365/129 |
| 2008/0143944 A1 * | 6/2008 | Chang et al. | 349/139 |
| 2008/0246704 A1 * | 10/2008 | Kawase | 345/80 |
| 2009/0014769 A1 * | 1/2009 | Collonge et al. | 257/314 |
| 2009/0038404 A1 * | 2/2009 | Tang et al. | 73/777 |
| 2009/0072296 A1 * | 3/2009 | Lee et al. | 257/324 |
| 2009/0072297 A1 * | 3/2009 | Lee et al. | 257/324 |
| 2009/0097315 A1 * | 4/2009 | Yun et al. | 365/185.13 |
| 2009/0108251 A1 * | 4/2009 | Kabir | 257/14 |
| 2009/0170231 A1 * | 7/2009 | Robert et al. | 438/50 |
| 2009/0221925 A1 * | 9/2009 | McCain | 600/509 |
| 2009/0242405 A1 * | 10/2009 | Mayer et al. | 204/435 |
| 2009/0278111 A1 * | 11/2009 | Pop | 257/4 |
| 2009/0284823 A1 * | 11/2009 | Chen et al. | 359/290 |
| 2009/0321793 A1 * | 12/2009 | Ollier et al. | 257/254 |
| 2010/0006840 A1 * | 1/2010 | Robert | 257/49 |
| 2010/0061143 A1 * | 3/2010 | Carley | 365/154 |
| 2010/0210073 A1 * | 8/2010 | Witvrouw et al. | 438/124 |
| 2010/0260946 A1 * | 10/2010 | Jia et al. | 427/569 |
| 2010/0295138 A1 * | 11/2010 | Montanya Silvestre et al. | 257/415 |
| 2010/0314668 A1 * | 12/2010 | Ollier et al. | 257/252 |
| 2010/0328898 A1 * | 12/2010 | Kabir | 361/713 |
| 2011/0081521 A1 * | 4/2011 | Kim et al. | 428/156 |
| 2011/0116974 A1 * | 5/2011 | Serban et al. | 422/88 |
| 2011/0147860 A1 * | 6/2011 | Robert et al. | 257/415 |
| 2011/0193053 A1 * | 8/2011 | Roca I Cabarrocas et al. | 257/9 |
| 2011/0212535 A1 * | 9/2011 | Kaul et al. | 436/149 |
| 2012/0190131 A1 * | 7/2012 | Novotny | 436/501 |
| 2012/0272742 A1 * | 11/2012 | Andreucci et al. | 73/778 |

OTHER PUBLICATIONS

Written Opinion of the International Searching Authority; PCT/US07/20490; Feb. 26, 2008.

* cited by examiner

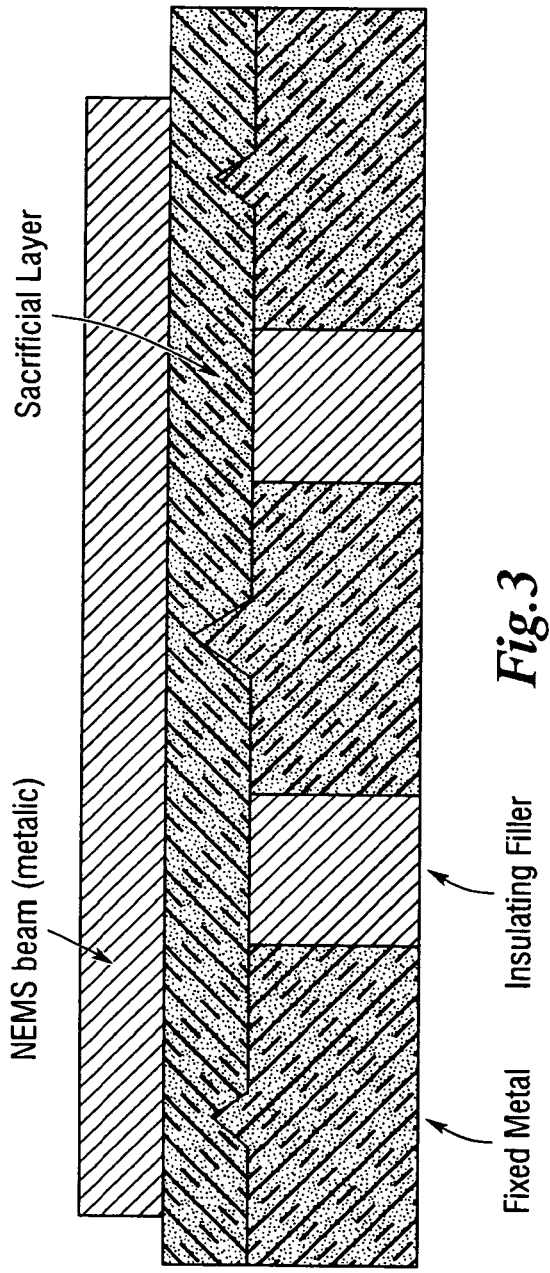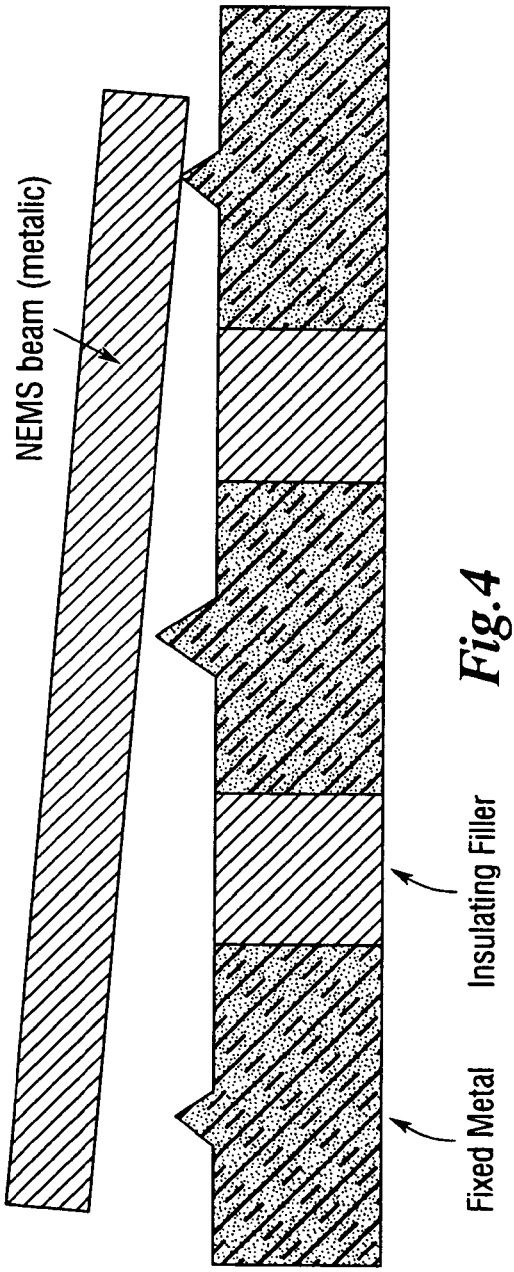
Fig.3
Fig.4

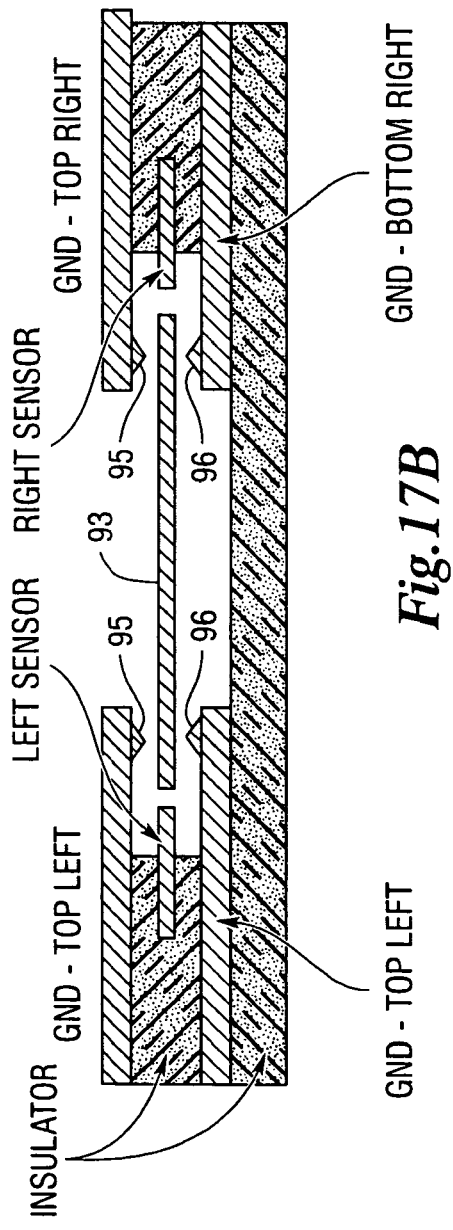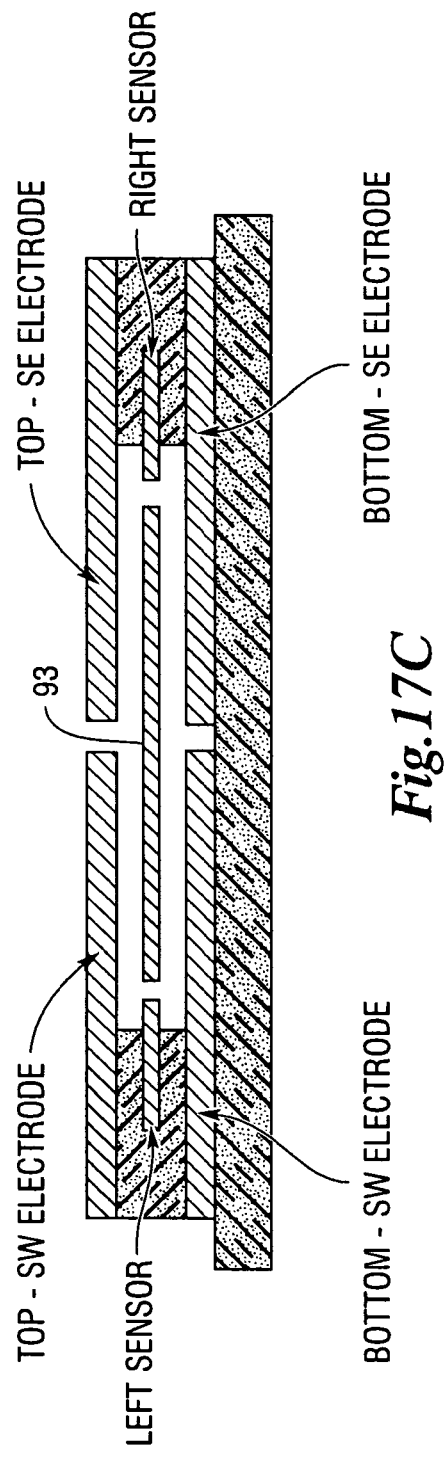

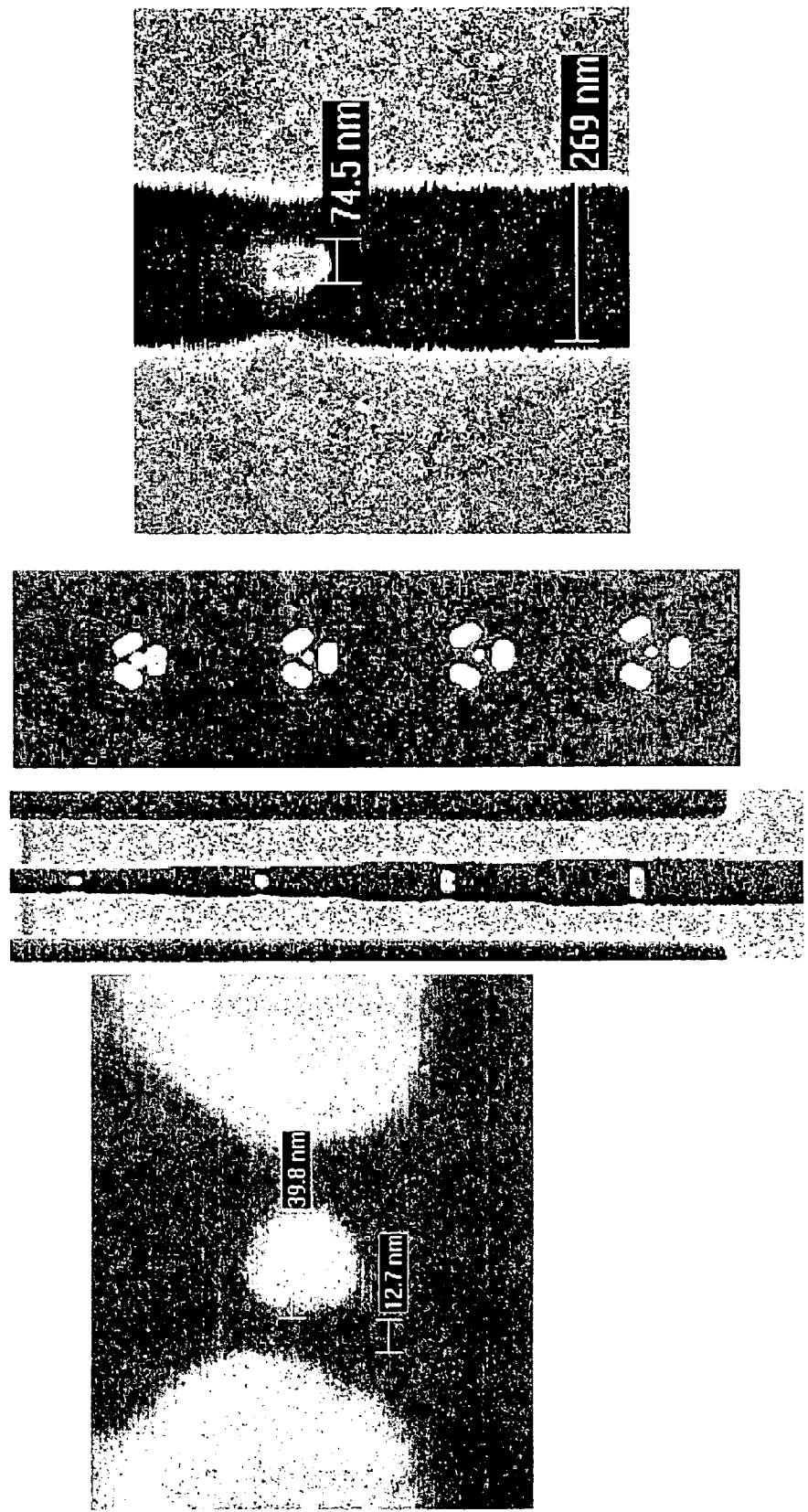

ASSEMBLING AND APPLYING NANO-ELECTRO-MECHANICAL SYSTEMS

CROSS REFERENCE TO RELATED APPLICATIONS

The application claims priority from PCT International Application Number PCT/US2007/020490 filed Sep. 21, 2007 and entitled Assembling and Applying Nano-Electro-Mechanical Systems, and U.S. application Ser. No. 60/846,691 filed Sep. 22, 2006 and entitled Assembling and Applying Nano-ElectroMechanical Systems, the entirety of both of which is are hereby incorporated by reference for all purposes.

BACKGROUND

This document addresses a novel method of constructing/assembling nano-electro-mechanical systems (NEMS) and the use of such systems for several important applications. In the context of this document, NEMS are mechanical systems in which one or more of the mechanical elements are smaller than 1 micron in all directions. The continuing evolution of optical lithography has made it possible to pattern objects whose dimensions are on the order of 100 nm today and are projected to reach 25 nm in the next decade. Micro-electro-mechanical systems (MEMS) have been commercially successful in a number of applications, particularly for acceleration sensing (e.g., Analog Devices' MEMS airbag sensors). Traditionally, MEMS consist of long thin beams that support large plates all patterned on top of a sacrificial layer and anchored to the underlying substrate at one or more points. After the device is completed, the sacrificial layer is etched away and the plate and beams are free to move except at the anchor points. Acceleration forces on the plate can generate sufficient forces to bend the beams due to their large aspect ratio (i.e., the length to width ratio or length to thickness ratio). However, for NEMS in which all dimensions are under 1 micron, it is impossible to construct beams that have sufficient aspect ratio to be bent by any reasonable acceleration forces. Therefore, the need exists for new methods for fabricating NEMS and new configurations of NEMS which overcome the problem of small aspect ratios.

SUMMARY

One aspect of this disclosure is that NEMS should consist of fixed structures and small (under 1 micron in all dimensions) movable structures. And, to be movable, these small elements must not be extensions of the fixed elements (as is the case in traditional MEMS). Instead, they must be fabricated as independent, unattached objects. During some portion of fabrication the objects would be in contact with one or more sacrificial or release layers. The objects would not be fabricated in contact with anything but sacrificial layers. By unattached, it is not meant that the movable components cannot touch the fixed components after release, e.g., a pivot arm that has been assembled on to a pivot point on a fixed member after the sacrificial layers are removed.

Another aspect of this disclosure is a method for assembling such independent unattached objects onto fixed elements or onto one another in a controlled repeatable manner, in particular, taking advantage of some type of force to direct the assembly. That is, during the removal of the sacrificial layer(s), at some point the NEMS object will become detached from any solid mechanical layer. One aspect of this disclosure is the use of some type of force to cause this nanoparticle to move to the desired location. At the nanometer scale, such objects can be held in a desired position by surface adhesion forces.

Another aspect of this disclosure is that such objects can be moved from their original assembled location by the application of electrostatic, magnetic, gravatic, thermal gradient, air pressure, centrifugal, centripetal, van der Waal, Casimir or other forces that can overcome the surface adhesion forces. This document goes on to describe a number of techniques for, controlling and modifying this surface adhesion force as this is useful in obtaining repeatable behavior in NEMS devices. In this way, the original advantages of MEMS can be maintained down to the nanometer scale. In addition, this document describes three exemplary applications of NEMS: nonvolatile memories, electrical switches, and inertial sensors.

BRIEF DESCRIPTION OF THE FIGURES

For the invention to be easily understood and readily practiced, the invention will now be described, for purposes of illustration and not limitation, in conjunction with the following figures wherein:

FIG. 3 is an example of one embodiment of an unattached NEMS beam located above fixed structures and having limited contact therewith (after release) according to an embodiment of the present disclosure;

FIG. 4 illustrates the NEMS device of FIG. 3 after release;

FIGS. 17A, 17B, and 17C illustrate an example of using a completely released object as an inertial sensor;

FIGS. 18A, 18B, and 18C illustrate various geometries constructed of 50 nm thick Pt using direct-write e-beam lithography before release;

DESCRIPTION

Figure 1A:
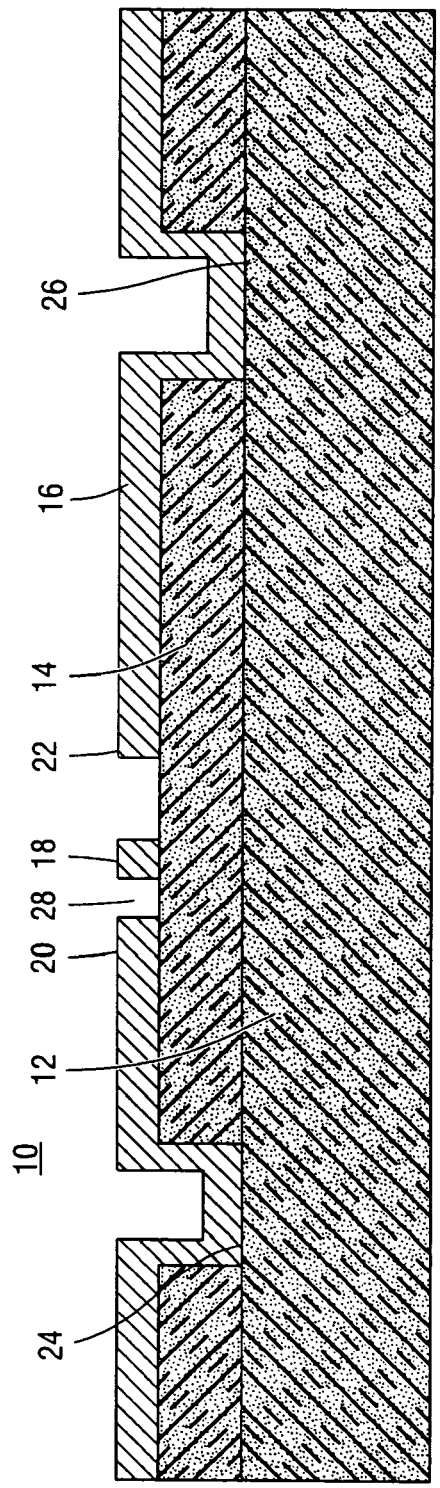
FIGS. 1A and 1B are examples of simple embodiments of a NEMS structure constructed according to the teachings of the present disclosure.

A simple example of a NEMS device 10 is shown in the FIG. 1A. The underlying substrate 12 could be any flat material, but would typically be a silicon wafer. The wafer could have transistors and interconnect patterned onto it if so desired. However, defining sub-100 nm features is generally easier if the surface is smooth; hence the surface would typically be planarized by a technique such as chemical mechanical polishing (CMP) if electronics is patterned beneath the NEMS structure. One advantage of a NEMS device (the overall assembly of NEMS objects, both fixed and movable that make up the complete device) described herein is that they can be created after all of the standard CMOS processing is done without damaging the CMOS devices or the interconnect. All of the process steps required to create typical NEMS devices can be done at low temperature.

In the simplest instantiation, a sacrificial layer 14 is deposited on top of the substrate 12 and patterned to leave sacrificial layer 14 under those parts of the structure that are to be movable. Then the NEMS layer 16 is deposited and patterned to form a movable portion 18 and a fixed portion having parts 20, 22. Thus, the moveable portion 18 is connected to the fixed parts 20 and 22 only through one or more sacrificial layers. Patterning of the NEMS layer 16 can be done additively by patterning a "liftoff" mask, depositing the desired material, and then lifting off the mask and the material that has fallen on top of the mask. Alternatively, this can be done subtractively—the material can be deposited everywhere, a photomask can be applied and patterned, and the material not covered by the photomask removed by some form of etching (typically reactive ion etching). One skilled in the art would be aware of any number of ways of depositing a thin film (sub-1 µm) layer and patterning it. Finally, the entire wafer is exposed to, for example, a gas phase etch that gently removes the sacrificial layer.

In the context of this document, the NEMS layer 16 would be a layer that is at least a modestly conductive layer—for example, a metal layer (e.g., Pt, Au, Al, Ni, C, etc.) or a conductive oxide layer (e.g., SrO, InSnO, etc.). Therefore, the NEMS layer 16 can be used to connect the device 10 to a top metal layer on the underlying IC (not shown) if so desired. One aspect of the present disclosure is a way of controlling what happens to objects that are small, unattached, and completely on top of the sacrificial layer 14 (such as moveable portion 18) when the release etch is carried out. In the context of this disclosure, the sacrificial layer 14 can be conductive or nonconductive. In all cases, this document describes a method of applying or creating a controlled repeatable force that directs the movement of the released object to the desired location on a fixed surface or on the surface of another movable object. In particular, the document describes the use of Casimir forces between conductive surfaces and the use of plasma induced electrostatic attractive forces to direct this assembly although any other suitable force(s) may be used; for example, a magnetic field gradient when the nanoparticles are composed of magnetic materials such as Ni, Co, or Fe.

Figure 2A:
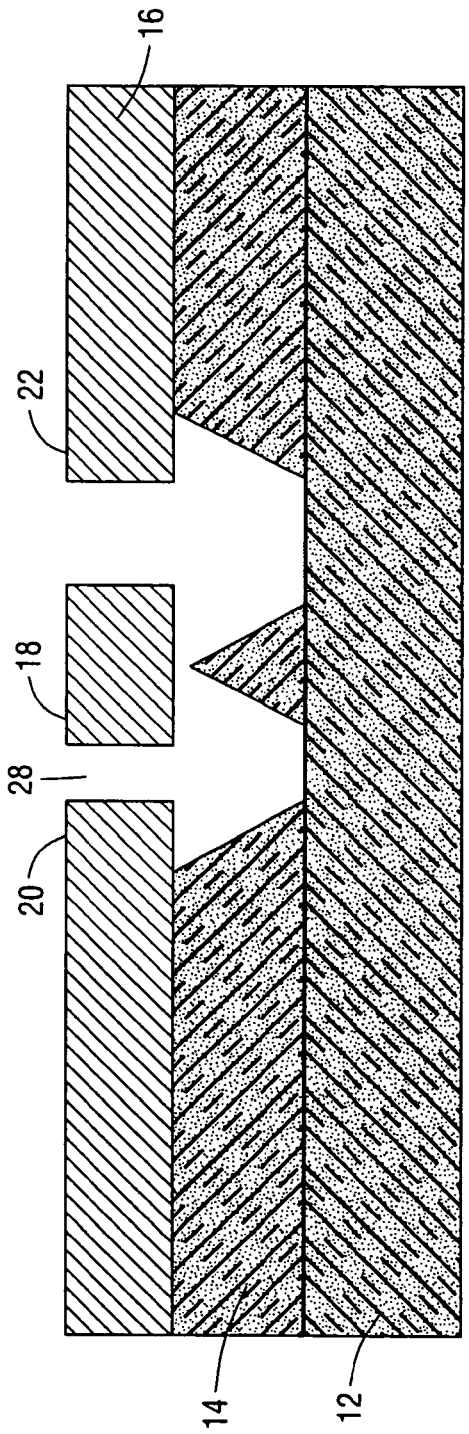
FIGS. 2A and 2B are enlarged views of the NEMS structure of FIGS. 1A and 1B, respectively, during release.

In general, when completely released structures are nearing the point at which their underlying sacrificial layer support is just vanishing, many things can happen to that structure. For example, FIG. 2A illustrates the device 10 of FIG. 1A during release. The device 10 in FIG. 2A has just reached the point at which the underlying sacrificial layer 14 has been etched completely through. At this moment, the movable portion 18 is free to move in any direction. It is subject to a number of forces. It could be blown away by the gas pressure due to the release etch gas or it could be pulled in the direction of the Earth's gravitation field. However, if there is only a small distance between the surface of the small released conductive movable portion 18 and one or both of the fixed conductive parts 20, 22, a force of attraction can be created that is stronger than any of the aforementioned external forces; and, that force of attraction can guide the assembly of the released movable portion 18 to the desired location. If the surface of the movable portion 18 and the wall of the fixed part 20 to which it is to be assembled are conductive and at the same potential, then a weak force of attraction exists between those two surfaces (typically called a Casimir force). Although much smaller than the force of gas pressure or gravity for micrometer scale objects, for nanometer scale objects, this weak force of attraction can be the largest force acting on the nanoparticle and can cause the nanometer scale released object to be attracted to the nearby fixed surface. In FIG. 2A, the Casimir force between the fixed part 20 and movable portion 18 will act to pull the released movable portion 18 up against the wall of fixed part 20. Note, if the sacrificial layer is itself conductive, then there will also be an attractive Casimir force between the released object and the remaining sacrificial layer below it which will pull the released object downward. If we wish to have the object move to the wall to its left, then the force of attraction between the wall and the object must be larger than the force of attraction between the remaining sacrificial layer and the object. This can be achieved by controlling the geometry through the mask pattern or by selecting a sacrificial layer that is an insulator.

If the released object and the surface to which it is to be assembled are at different potentials, then there is an electrostatic attractive force in addition to the Casimir attractive force. This desirable situation can be created in at least three possible ways. First, this situation can be created by attaching separate wires to the sacrificial layer and the fixed surface. In that case, the potential of the object will be set by the potential of the sacrificial layer at the instant it is etched through. This approach is cumbersome in that there must be an insulator between the conductive sacrificial layer and the layer making up the fixed surface to prevent those layers from shorting and there must be wires attached to the wafer during the release etch process.

This document also describes a novel technique for creating an electrostatic attractive force to help assemble the objects. In particular, the sacrificial layer is chosen to be an insulator or a poor conductor and the release gas is chosen to be a charged species. For example, the insulator could be polyimide or photoresist and the release gas could be an oxygen plasma. In the case of an oxygen plasma, the negatively charged oxygen ions would tend to charge the released object with respect to the fixed surface (assuming that the fixed surface is also connected to the wafer electrically so that its ionic charging is bled off through the wafer to the chuck of the release etch tool). For example, this desired geometry is shown in FIG. 1A. As long as the substrate is conductive, the charge delivered by the release gas plasma to the fixed parts 20, 22 will be carried to ground through the substrate at points 24, 26 while the charge delivered to the released movable portion 18 will create a different potential on that object.

Figure 1B:
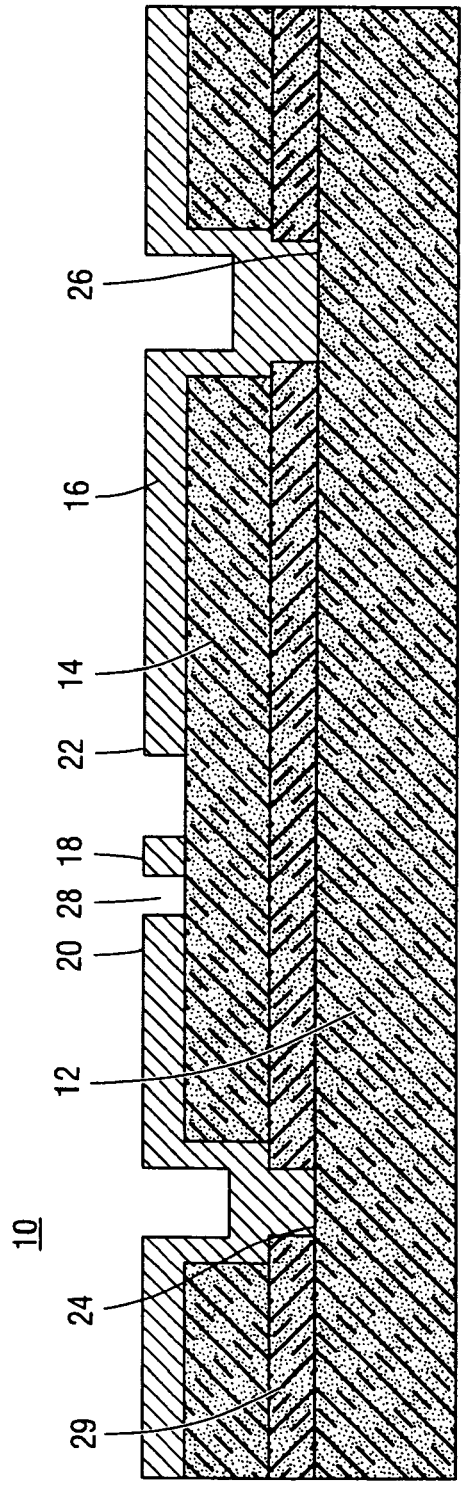
Figure 2B:
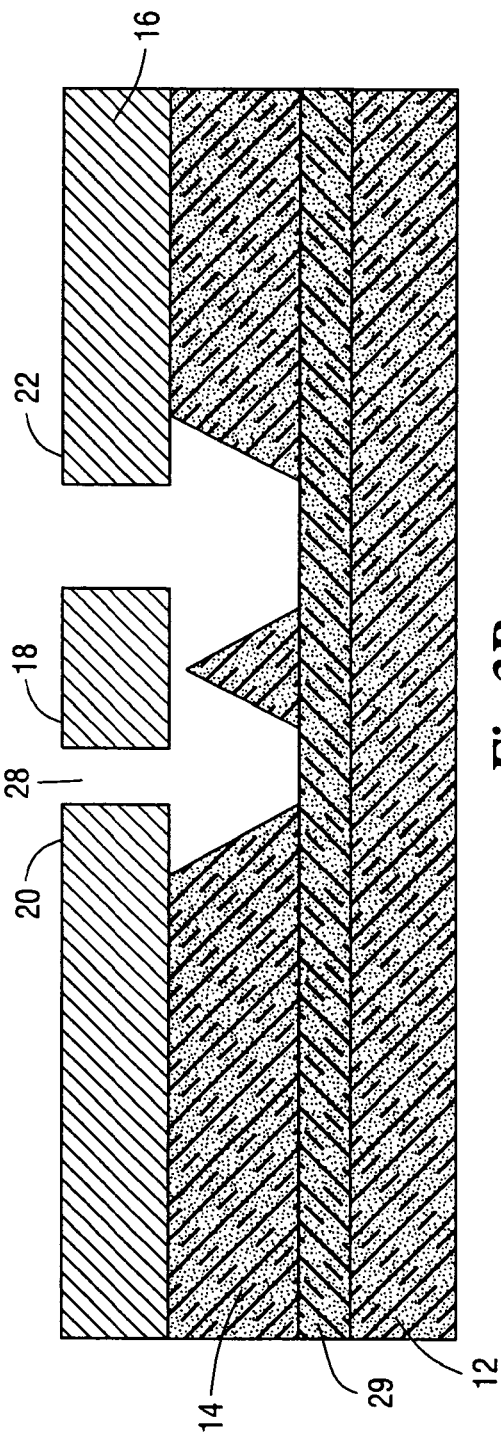

A variation on this last technique that allows a conductive sacrificial layer to be used is to insert an insulating layer 29 under the sacrificial layer 14 as shown in FIG. 1B and FIG. 2B. In this case, the plasma release etch is carried out in such a way that in open areas the sacrificial layer 14 is removed all the way down to the insulating layer 29. In a Reactive Ion Etching system, this can be done by starting with a highly anisotropic etch recipe and then switching to a more isotropic etch recipe once the sacrificial layer 14 has been removed all the way down to the insulating layer 29 in the regions not covered by the NEMS layer 16. Because the fixed NEMS elements 20, 22 are connected to the conductive substrate 12 through bleed points 24, 26, which bleed off the plasma beam current, the plasma current charges both the nanoparticle 18 and the underlying sacrificial layer 14 to a potential significantly different from the potential of the substrate 12. The plasma current cannot flow laterally from the nanoparticle 18 through the sacrificial layer 14 to the substrate 12 because the sacrificial layer 14 underneath the nanoparticle 18 has been separated from the rest of the sacrificial layer by the initial (the one in which the sacrificial layer is removed down to the insulator in regions not covered by the NEMS layer) phase of the release etch. In the case of a conductive sacrificial layer, the electrical potential of the nanoparticle 18 and the sacrificial layer immediately under it will be the same until the nanoparticle is completely undercut. Therefore, at the critical instant of release, there will be no electrostatic attraction between the nanoparticle and the remaining sacrificial layer beneath it because they are at the same electrical potential. But, there will be a significant potential difference between the fixed part 20 and the moveable part 18 causing an electrostatic attractive force that will guide the assembly of nanoparticle 18 to fixed surface 20. This is the preferred embodiment for the assembly technique. It can generate a significant force. The method of this disclosure includes adjusting the mask geometry so that a very small gap 28 exists between released movable portion(s) 18 and the part(s) 20 at which they should be assembled. The electrostatic or Casimir force will then guide assembly of the released objects to the desired points during the gas or plasma release etch. That is, one aspect of the method is to design the mask patterns so that all fully released objects are placed sufficiently close to a fixed object or another fully released object so that they move predictably under Casimir and electrostatic forces instead of moving randomly during the release process.

In this way, we can predictably and repeatably assemble millions or even billions of fully released objects into precise alignment with the fixed objects attached to the surface of the substrate. The exact gap required to cause this assembly is on the order of 50 nm or less for Casimir forces only but can be larger for Casimir plus electrostatic forces. The exact distance depends on the specific geometry, the mass of the fully released object and the fixed object, and the release process.

The same fundamental method of assembling NEMS objects can be used in the vertical direction as well. In this case, a surface of the NEMS object would be positioned in proximity to a conductive surface (either fixed or mobile) above or below it, separated by a thin sacrificial layer. When the last bit of sacrificial layer holding the NEMS object in place is vaporized, the object can be attracted by Casimir and electrostatic forces toward the nearby surface and will become attached there by surface adhesion forces. For example, the teeter-totter structure shown in FIG. 3 and released in FIG. 4 is an example of a released beam that is assembled to a fixed layer below it. Note, for electrostatic forces to be effective in this case, the sacrificial layer need not be an insulator. In particular, when the direction of desired assembly here is "through" the sacrificial layer, every time the layer immediately under the NEMS object is etched away, we want the NEMS object to be attracted to the apex of the remaining sacrificial region. In this way, the nanoparticle can gradually move to the desired assembly point as the sacrificial layer is gradually removed.

Figure 5:
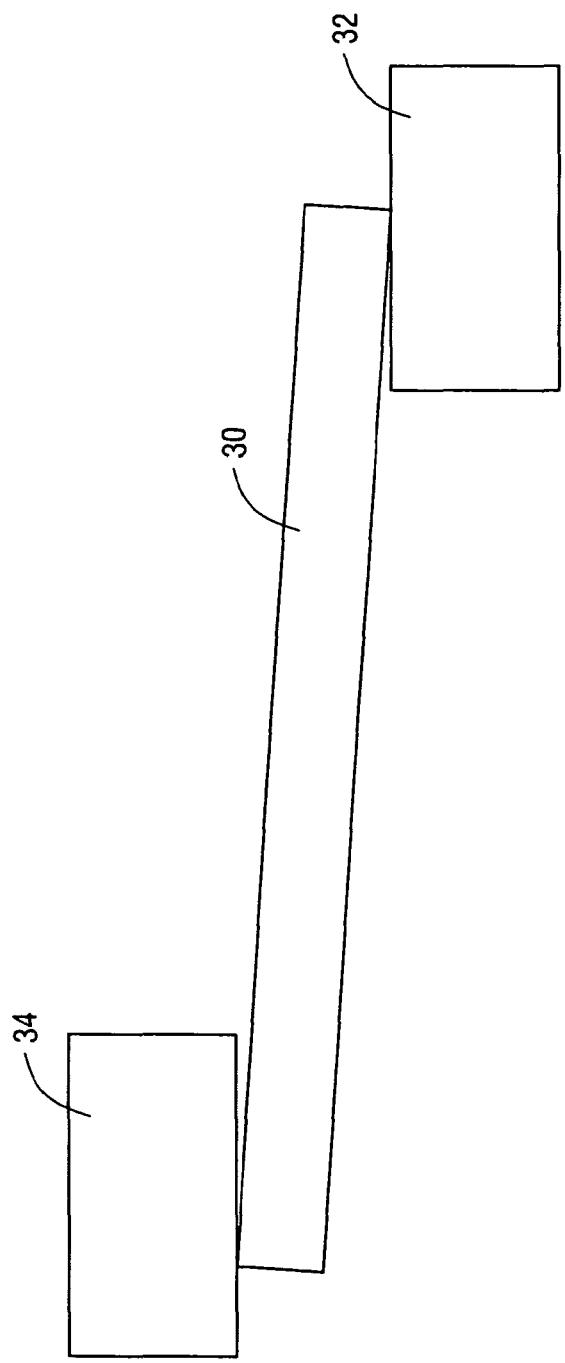
FIG. 5 illustrates an unattached NEMS beam assembled at two fixed points according to an embodiment of the present disclosure.

Similarly, the concepts of this disclosure can also be extended to assembling NEMS objects at more than one point. For example, as shown in FIG. 5, a 500 nm long 50 nm diameter cylinder 30 (i.e., a movable portion) can be fabricated in conjunction with a fixed portion such that one end of the cylinder 30 is near a fixed part 32 and the other end of the cylinder 30 is near a fixed part 34. Casimir and electrostatic forces acting at both ends of the movable, unattached, NEMS cylinder 30 can pull it into contact with parts 32, 34 simultaneously as shown if FIG. 5. Finally, this same concept can be extended to include attraction of a NEMS object at three points. Consider for example a triangular NEMS object (not shown). By placing a fixed surface a small distance away from each of the points, the object can be attracted simultaneously to three points. Note, for a rigid NEMS object and fixed surfaces, this is the maximum number of simultaneous attraction points that can be employed for reliable assembly of a NEMS object. However, if the object itself consists of two or more separate objects that are held together by surface adhesion forces, or if the fixed surfaces are modified to be movable objects themselves, additional points of simultaneous attachment are possible without limit.

Once Casimir and electrostatic forces have been employed to pull the fully released small objects into contact with nearby surfaces (fixed or other released ones), the NEMS device is assembled. While this is sufficient for some applications, other applications require that modest forces be able to move NEMS objects during operation. This requires that the strength of the surface adhesion forces operating between the surfaces that were assembled be repeatably and accurately controlled. That is, to achieve the desired operation some NEMS devices will require that these small released objects be moved from their initial point of contact in response to some real world force; e.g., gravity, motion, gas pressure, electrostatic force, magnetic force, photon pressure, etc. For modest forces to result in motion, we must limit and control the surface adhesion force. In particular, this requires that we control both the contact area between the surface of the released object and the surface to which it is adhering, the effective separation between the surfaces, and the material characteristics, particularly their adhesiveness to each other, of the surfaces.

The shape of the contact area is controlled in the plane by the shape of the mask pattern that is used to define the fully released object and the nearby surface to which it will be attracted. For example, the most classical assumption is that the released object is a perfect sphere and the fixed surface is a perfectly flat plane. Note, however, that the idea described in this document can be applied to any shape. For example, in some cases the specific deposition method can be exploited to control the contact area and hence the adhesion forces. For example, in materials that are liftoff patterned, there is typically an extremely sharp lateral edge which is created by the narrowing of the opening through which the material is being deposited due to the deposition of the material on the side wall of the mask layer. This can be used to create an extremely small contact area in the vertical dimension.

Figure 6:
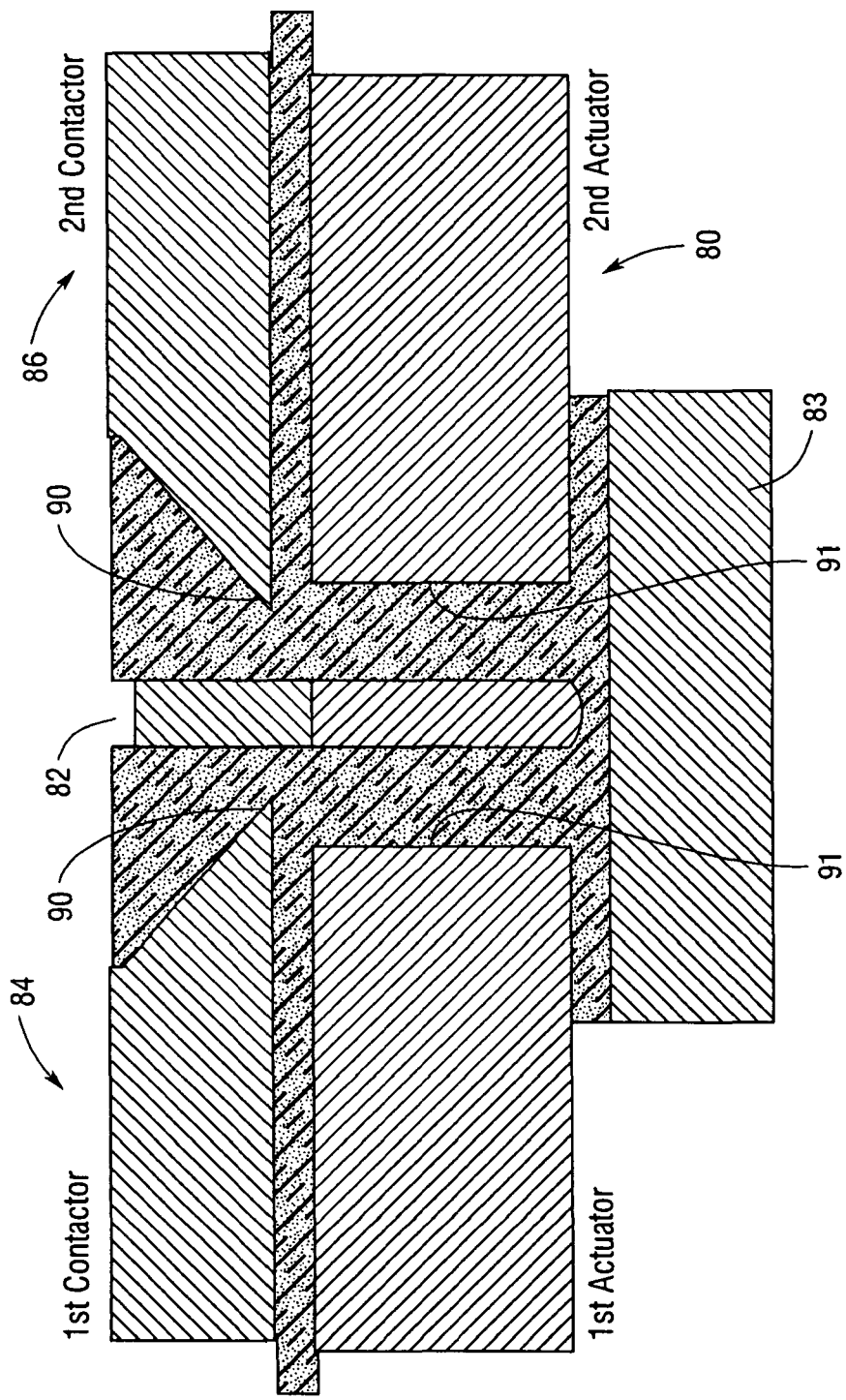
FIG. 6 illustrates an example of a NEMS device in which the actuators have a much larger surface area than the surface area of the contactors according to one embodiment of the present disclosure. A liftoff pattern is used to obtain a sharp edge for the contact portion.
Figure 7:
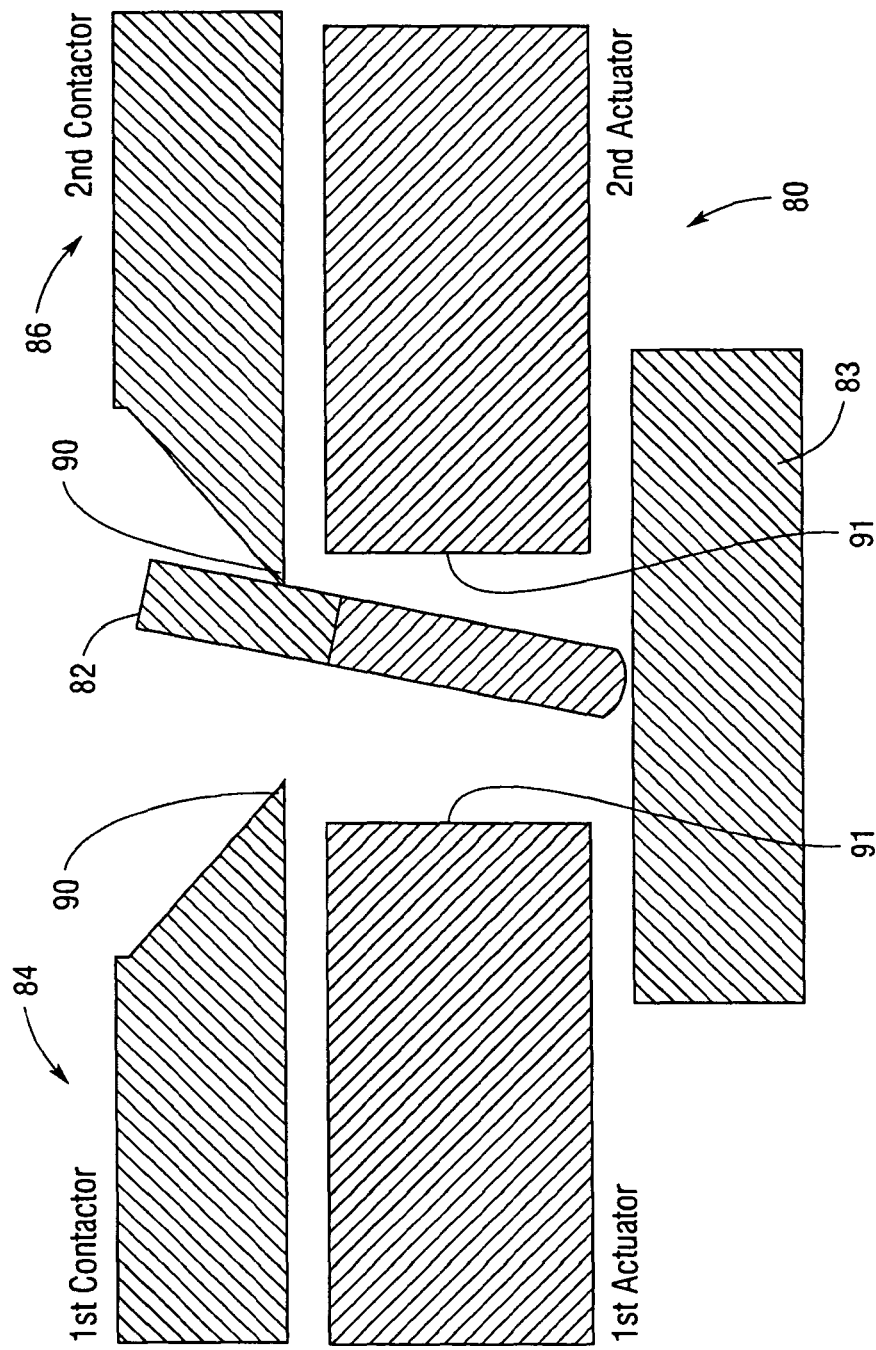
FIG. 7 illustrates the NEMS device of FIG. 6 after release.

Turning to FIGS. 6 and 7, a device is shown having a fixed portion 80, a movable portion 82, and a primary electrode 83. The fixed portion 80 is comprised of a first part 84 having a contact surface 90 on a first contactor and an attractive surface 91 on a first actuator. The fixed portion 80 is also comprised of a second part 86 which also has a contact surface 90 on a second contactor and an attractive surface 91 on a second actuator.

The structure shown in FIG. 6 and FIG. 7 exploits the sharp edge typical in a liftoff process to produce the first and second contactors. In addition, in the case when motion is desired in the vertical plane only, if the NEMS layer is patterned as a straight line adjacent to the fixed layer, then an extremely sharp knife edge in the vertical direction will be attached along a line. This will create a movable NEMS object that is hard to move in plane but easy to move vertically (at the far end from the attachment point). Or, if the NEMS object is desired to move in the horizontal plane, make contact with a surface, but then have low enough surface adhesion that electrostatic forces can separate that contact at a future point in time, then use of liftoff patterning may be advantageous. In FIGS. 6 and 7 it is seen that the surface areas 91 of the first and second actuators is much greater than the contact surfaces 90 of the first and second contactors. That enables a large attractive force to be generated while the force created by the contact of the two parts is lessened due to the reduced surface area.

Another related processing technique that creates a small contact area in the vertical direction is the sputter deposition through a small hole in a liftoff mask. In this case the buildup of material on the walls of the hole narrow the deposition until it ends in an upward facing point. This technique is well know (Spindt tip method) for making field emission cathodes. In this case it can be used to create small contact area features; e.g., see FIG. 3 and FIG. 4.

One of the concepts of this disclosure is that any processing technique that results in reduced contact area can be exploited to control the adhesion forces between NEMS surfaces.

The separation between surfaces is normally limited by a balance between the overall surface attractive forces and the repulsive forces resulting from when a few asperities that stick out from the surfaces come into contact with the opposite surface before the majority of the surface does. Those asperities become compressed resulting in a force to balance the attractive force. For contact surfaces that are extremely rigid and inflexible, contact separation is typically at the distance between the maximum peak height of the surface and the average height of the surface (assume the opposing surface is perfectly flat). Thus, one technique for controlling the contact forces is to intentionally create surface roughness on the released object, the fixed surfaces, or both. Normally, to prevent asperities from one surface interlocking with asperities from the other surface, only one surface would be roughened in processing and the other surface would be kept as smooth as possible.

Another approach to achieving a controlled separation between the two surfaces is to coat one or both surfaces with a nonconductive layer. This can be done as a thin film deposition before the release. Alternatively, the release can be partially carried out to expose much of the underside of the released object, and then the thin film spacing layer can be deposited. Note, because of the topography of the surfaces that must be covered, conformal deposition techniques such as CVD (chemical vapor deposition), PeCVD, or ALD (atomic layer deposition) would be preferable for applying these adhesion reducing coatings.

Example 1

NEMS Memory Systems

Future generations of Flash Memory (the driver behind the I-Pod Nano, etc.) may well employ nanometer-scale particles of material that move between two electrodes. The "memory" is retained by the surface adhesion forces that keep the particle attached to one of the two electrodes until a sufficiently strong writing force is applied to move the particle to the other electrode. Such memories are impractical if the particle is on the order of 1 micrometer across, but become extremely attractive if the particle is 25 nanometers across. In fact, such mechanical memories would continue to scale down to features sizes below 10 nanometers.

The proposed memory system relies on the adhesion of a nanometer scale metal particle to one of two possible nanoscale wires. The state of the memory device can be reversed by applying a voltage difference between the wires that results in an electrostatic force that transfers the nanometer scale particle from one metal line to the other.

Figure 8:
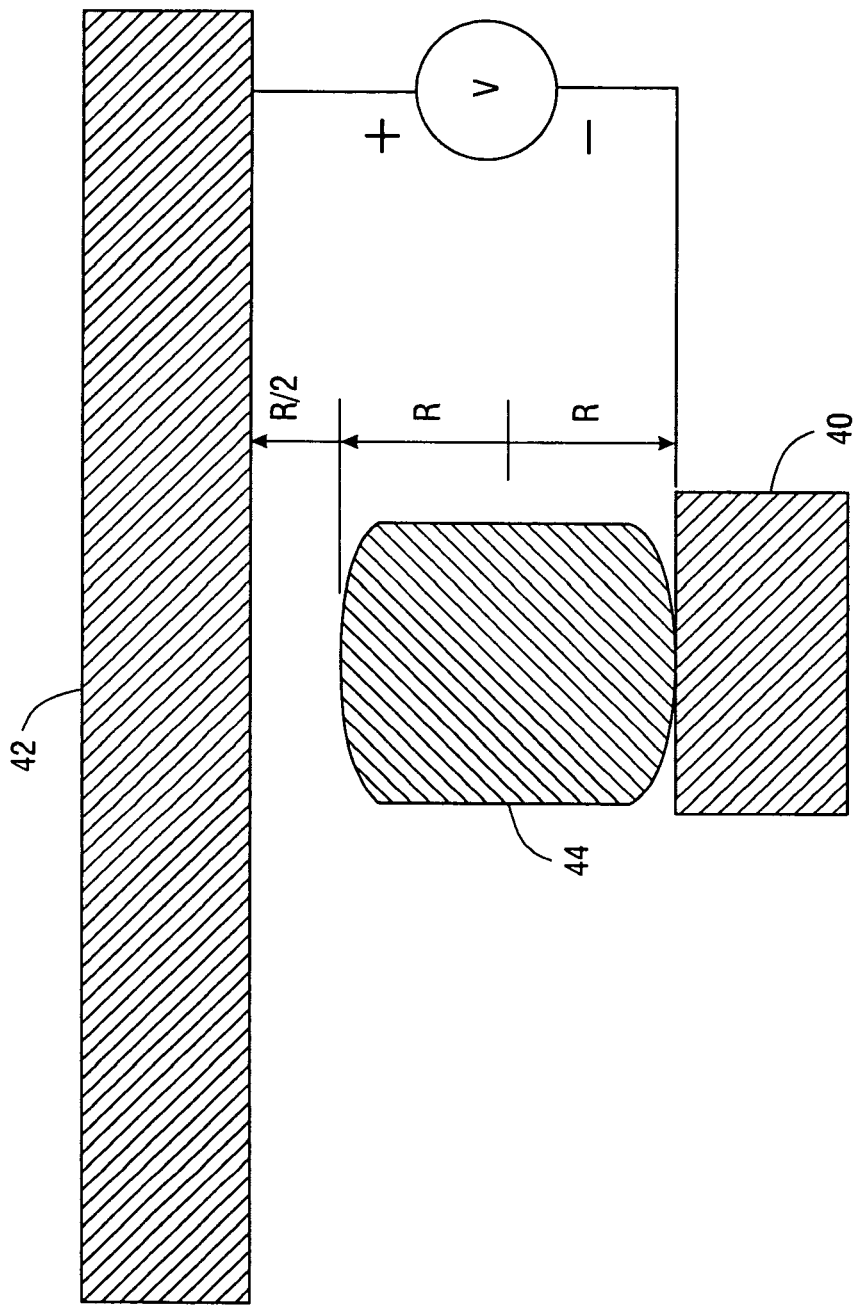
FIG. 8 illustrates one possible geometry of a NEMS nonvolatile memory cell constructed according to the teachings of the present invention.

Consider a memory cell as shown in FIG. 8 composed of a fixed portion comprising a metal line 40 at one extreme and extending into and out of the page and a horizontal metal line 42 at the other extreme and extending across the page. In between, assume that a roughly cylindrical particle 44 (movable portion) with rounded faces has been formed. Note, there are a number of processing tricks that can be used to create rounded top and bottom faces; e.g., a liftoff process will create a rounded top and if there is a brief ion milling done before the deposition, the sacrificial layer will have a rounded pit etched into it which will result in a rounded bottom face. For analysis sake, assume that the particle 44 is a sphere. The diameter of the spherical particle, R, would be approximately the minimum feature size that can be reproduced. The bottom line 40 would also have a width equal to the minimum features size while the top metal line 42 would be slightly wider (roughly 20%). Specifically, a voltage smaller than the voltage required to move the sphere from one side to the other would be applied to either the row lines or the column lines in a memory array. The potential on the other set of lines would be maintained by a low input impedance charge sensing circuit (typically these are built as switched capacitor sensors). If the sphere 44 is approximately the size of the wider of the two lines, there will be a smaller increase in capacitance when the sphere is attached to that line. Typically in a memory array, a reference cell would be used to provide a manufacturing variation tolerant threshold for separating 1s and 0s from each other.

Note, for the sphere 44 to be free to move, it would be fabricated with a sacrificial layer above and below it. These sacrificial layers would be etched away with a dry release etch. Casimir and electrostatic forces would cause the sphere to move to an electrode (line 40 or line 42) during the release process. In the proposed memory system, the state of the memory cell is determined by whether the sphere is stuck to the bottom electrode (i.e., a bottom landing point) or the top electrode (i.e., a top landing point).

Figure 9:
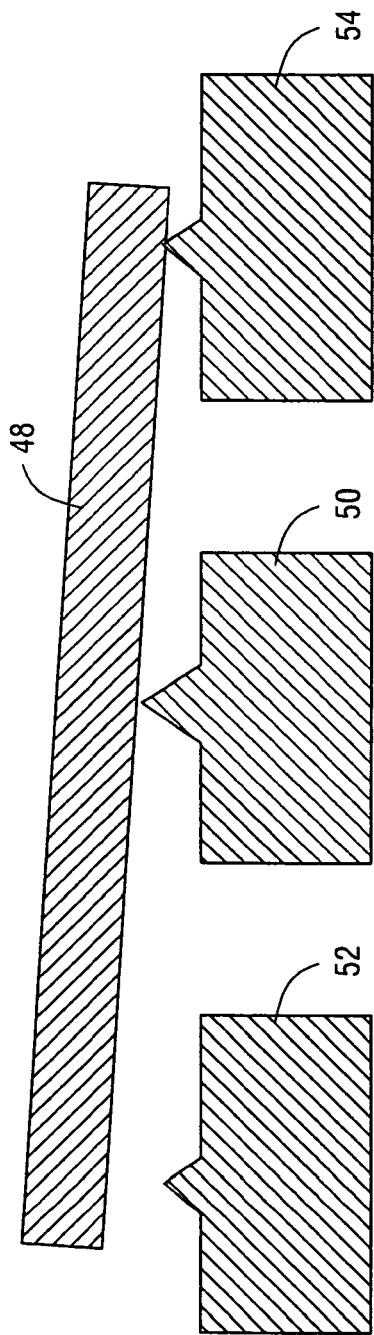
FIGS. 9 and 10 illustrate another possible geometry of a NEMS memory cell based on a teeter totter design.
Figure 10:
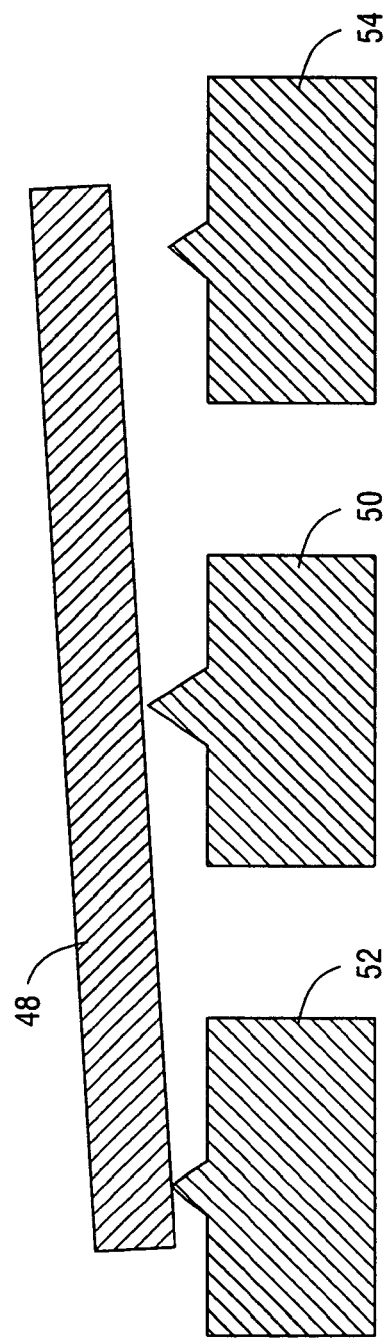

An alternative memory design might employ an elongated beam 48 that is adhering to a support post 50 in the middle—see FIG. 9 and FIG. 10. The beam 48 would be attached weakly to one of two landing points 52, 54 on either end. By applying a voltage to an electrode beneath the "teeter totter" structure, the side to which the beam 48 is adhering can be switched. This is an alternative implementation of the spherical particle design. Note, FIG. 10 also indicates the use of a Spindt tip structure on top of the bottom metal deposition to control the contact area between the beam 48 and landing points 52, 54. Note, the taller tip in the middle is achieved simply by having a slightly larger opening in the liftoff mask for the center tip as this will close up later resulting in a taller tip.

Figure 11:
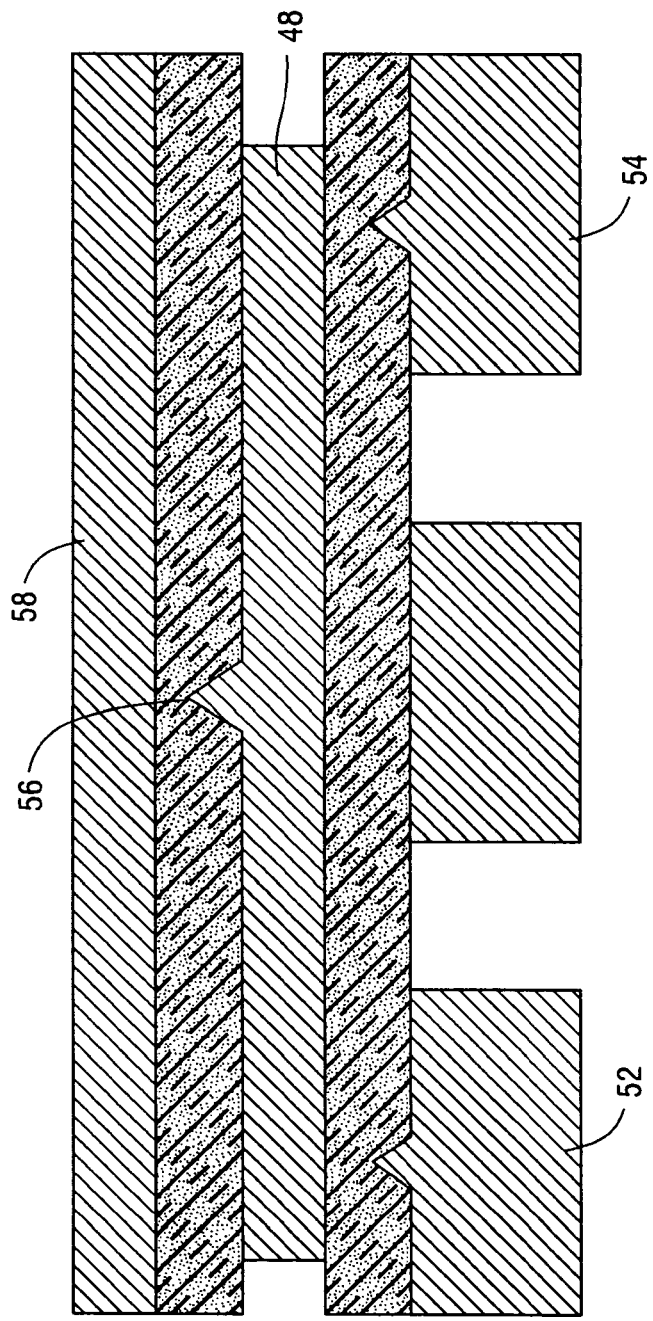
FIG. 11 illustrates another possible geometry of a NEMS memory cell based on an inverted teeter totter design.
Figure 12:
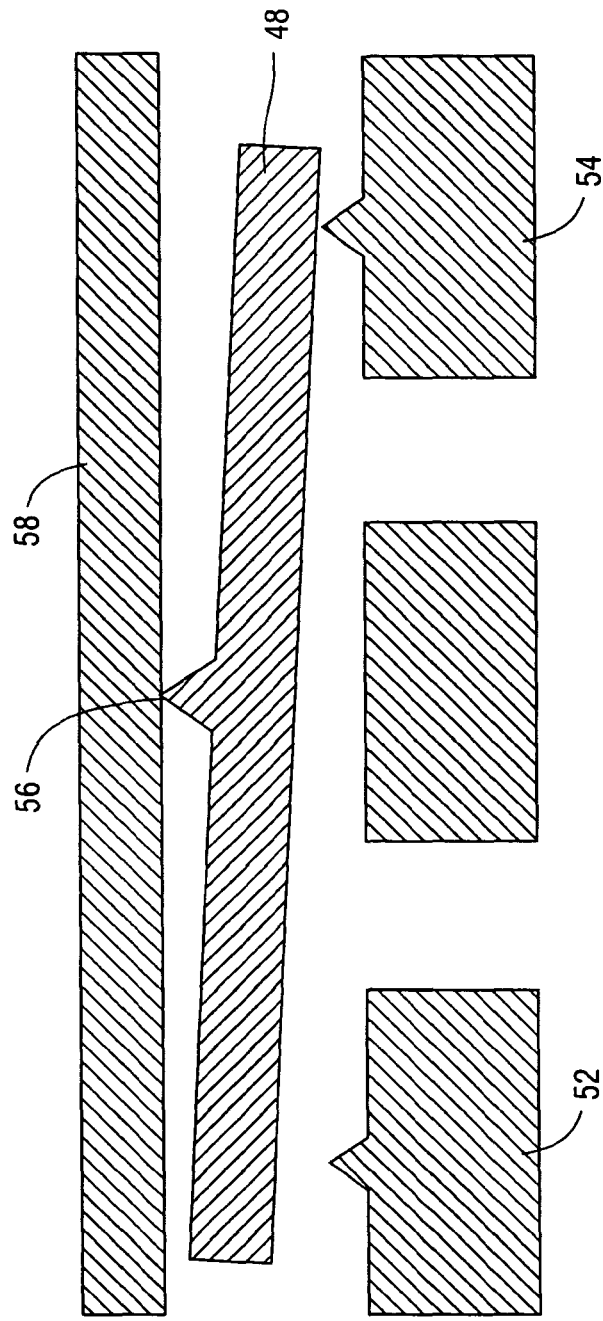
FIG. 12 illustrates the NEMS device of FIG. 11 after release.

FIG. 11 and FIG. 12 show a variation on this idea in which a fulcrum 56 is formed on top of beam 48 opposite the landing points 52, 54. This is advantageous in a memory design as it facilitates two level routing in a row column fashion. In this case a Spindt tip is also placed on top of the movable beam 48 to limit its contact area with the upper fixed metal structure 60.

Example 2

NEMS Switch

In deeply scaled CMOS processes, the ratio of the conductivity in the ON and OFF state is steadily decreasing as feature sizes decrease. This has dramatically increased the problems faced when the designer wishes to create low power systems. NEMS switches offer the opportunity to create a switch that has virtually no leakage current when off and a very small resistance in the ON state. Such switches could be used in the power distribution tree of sub-100 nm CMOS processors to turn off power to logic and memory sections that are currently not needed. Additionally, such nearly ideal switches could be used to make ultra low power logic (albeit, rather slow logic as the switches are still mechanical and require a finite time to switch from ON to OFF and vice versa). Logic and memory circuits built from mechanical components would have the advantage that they would be extremely tolerant of radiation which would be important in space and military applications. Finally, in analog and RF circuits, there are many applications for switches with a very high ratio of ON to OFF state resistance. For example, in the front end of GSM cellular receivers switches are used to connect the antenna to the appropriate filter plus low noise amplifier or power amplifier. In the ON state, these switches must have only a few ohms of admittance. In the OFF state, the higher the admittance of the switch, the less loss it will cause of whichever transmit or receive path is active.

The proposed switch relies on the ability to assemble a movable switch bar that is completely released from the substrate. This is quite different from the existing background for constructing MEMS switches. In MEMS switches, the movable switch arm is normally anchored at one end to the substrate. Electrostatic, magnetic, or thermal bimorph force is used to bend the switch arm into contact with the fixed end of the switch. In the proposed invention, the entire switch arm is a completely released object. It is assembled onto the fixed contact point using Casimir and electrostatic forces and held there by surface adhesion. Electrostatic or magnetic force can be used to deflect the switch from the ON position to the OFF position when so desired.

Figure 13:
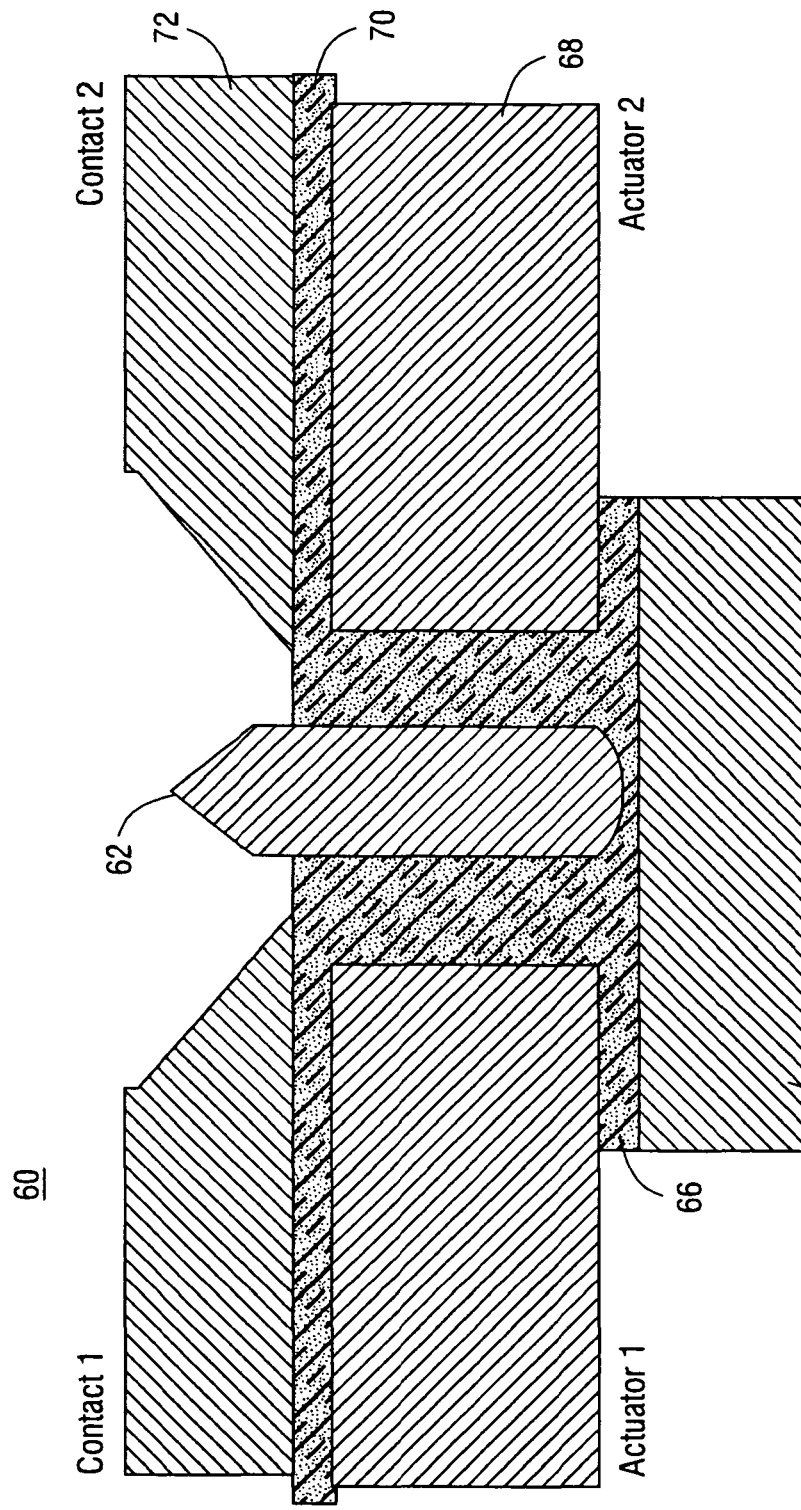
FIG. 13 illustrates the use of the device of FIG. 6 as a vertical bar switch.
Figure 14:
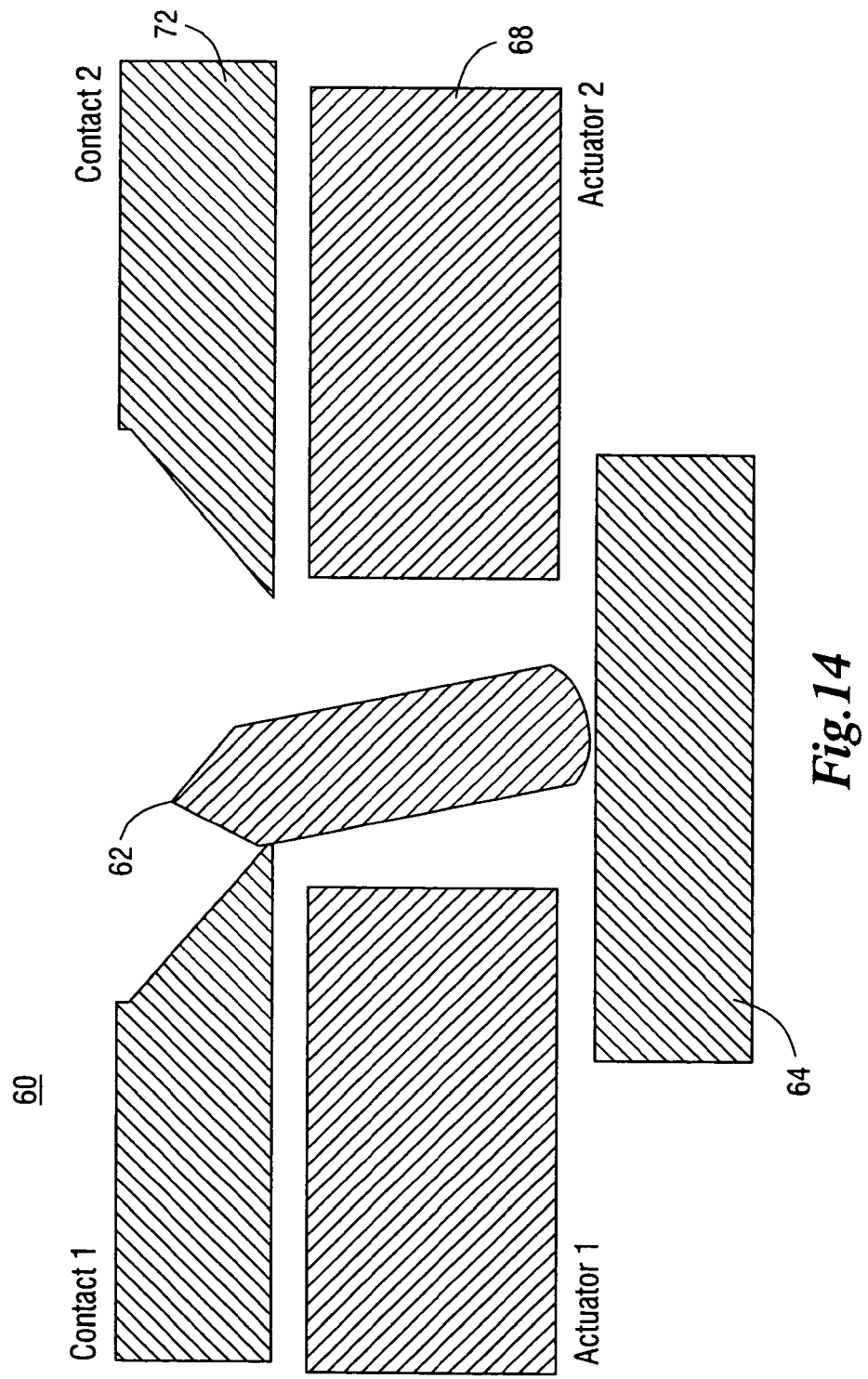
FIG. 14 illustrates the switch of FIG. 13 with the movable arm switched to fixed contact 1.

In this section, the preferred embodiment for a NEMS switch is described. One skilled in the art will realize that many other similar geometries can be used to create the same basic design. Consider for example a vertical switch 60 having a movable arm 62 that is formed as shown in FIG. 13 and FIG. 14. This structure is built up from three metal layers and two sacrificial layers. The bottom common electrode 64 is deposited first. Then a sacrificial layer 66 is placed above it. This might be planarized with CMP, but need not be. The second metal layer 68 would be patterned to create the bottom end of the movable arm 62 and the actuator electrodes. The second sacrificial layer 70 would be deposited over the entire structure. Note that the view shown in FIG. 13 assumed CMP is used, but this need not be the case. Finally the a liftoff mask would be used to pattern a third metal deposition layer 72 which makes up the fixed contact arms and the top half of the movable arm 62. This structure takes advantage of sharp lateral edge that occurs in many liftoff patterned structures to limit the contact area between the fixed arms of the switch and the movable arm 62. However, one skilled in the art would be able to use many other techniques to achieve reduced adhesion forces between the fixed contacts and the movable arm.

Figure 15:
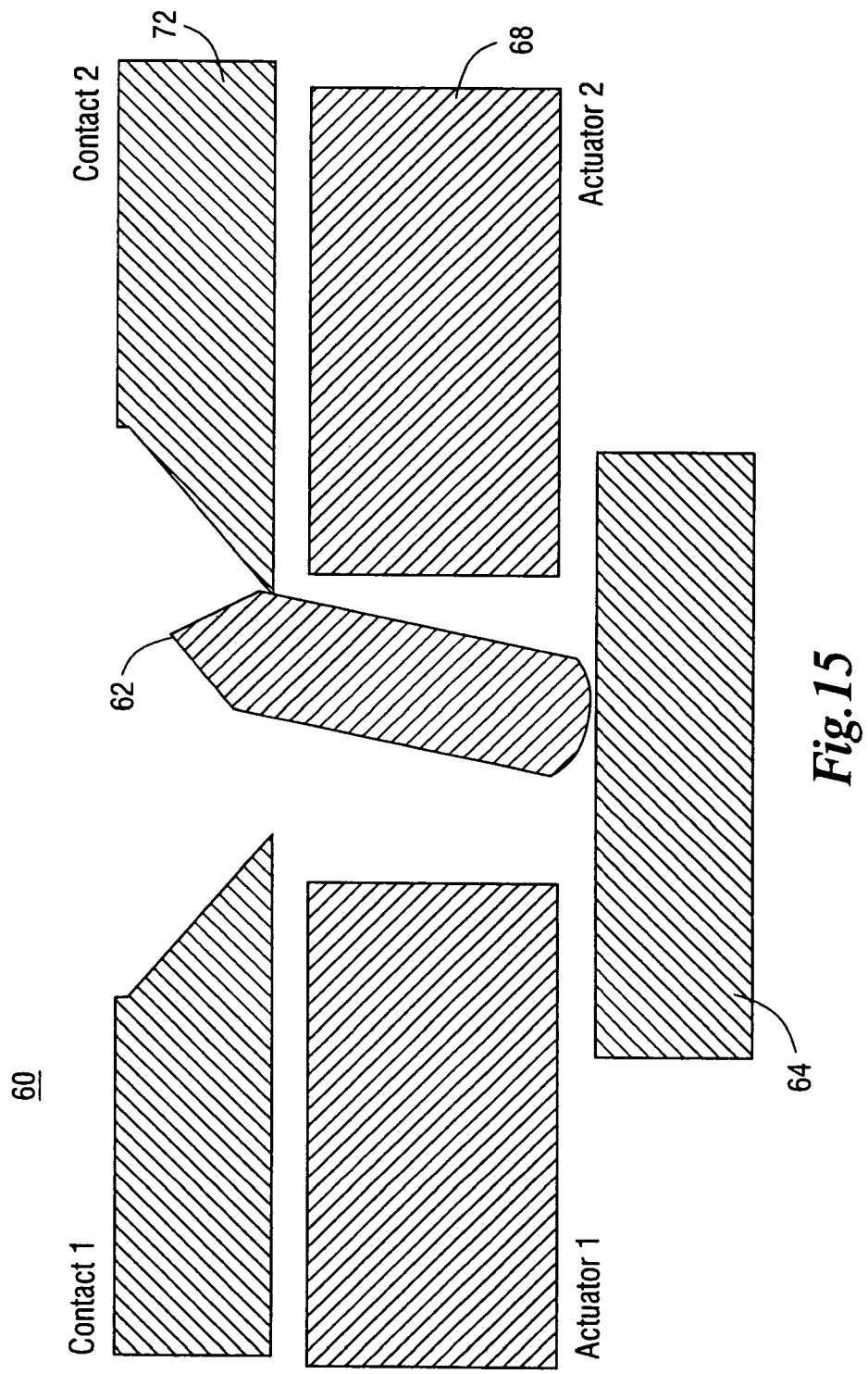
FIG. 15 illustrates the switch of FIG. 13 with the movable arm switched to fixed contact 2.

After release, the movable arm 62 will drop down into contact with the bottom fixed electrode 64, and will tip into contact with one of the fixed arms or the other as shown in FIG. 14. By applying a large voltage between the bottom fixed electrode 64 and the actuator 2, the surface adhesion of the movable arm 62 to fixed arm 1 can be overcome and the movable arm 62 will swing into the position shown in FIG. 15. The process can be reversed by applying a large voltage between the bottom fixed electrode 64 and the actuator 1. In this way, we have created a single pole double throw switch.

Figure 16:
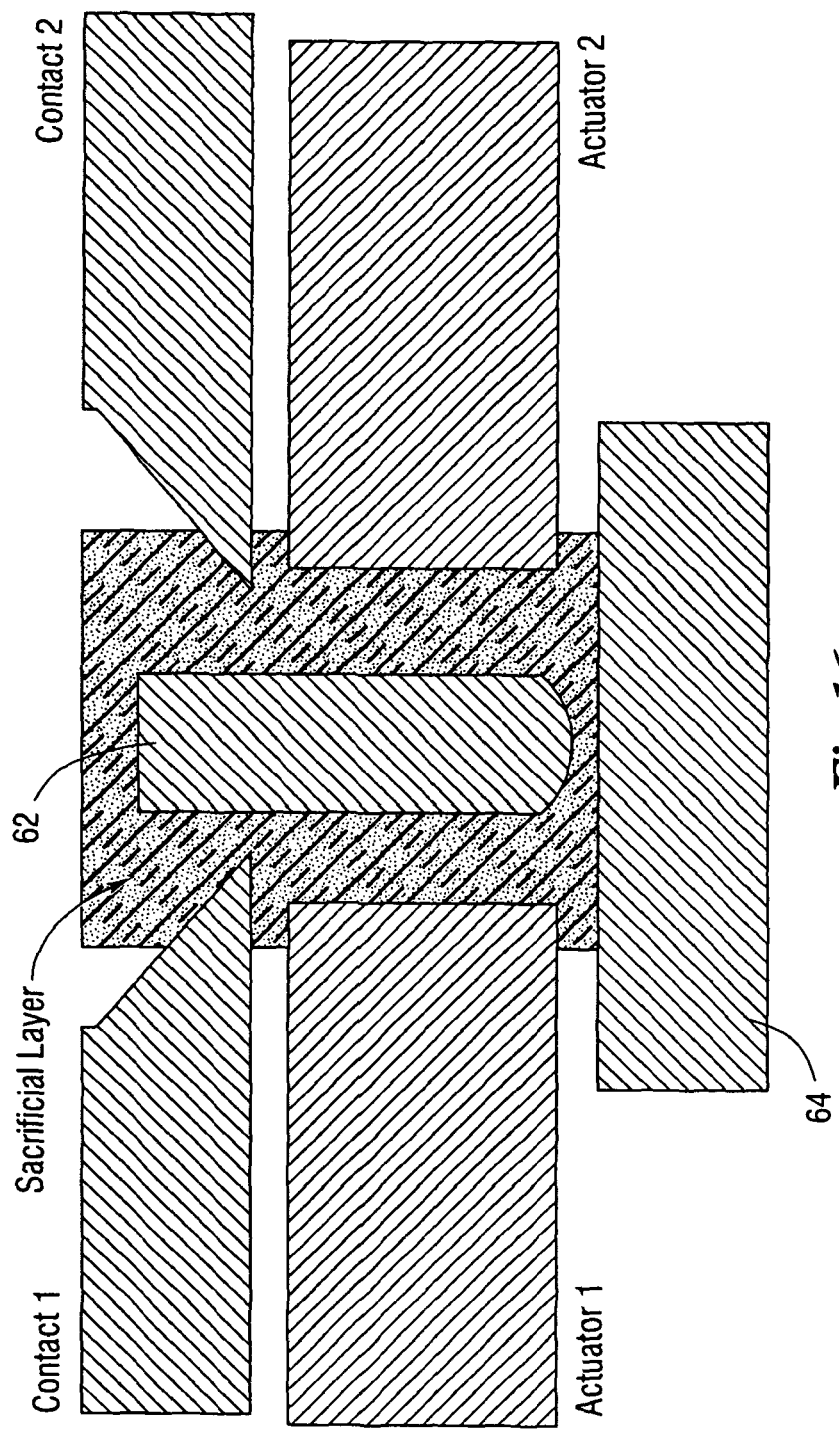
FIG. 16 illustrates a switch similar to the vertical bar switch of FIG. 13 but constructed in-plane according to the teachings of the present invention.

One skilled in the art will realize that many different geometries are possible using this basic invention. For example, the arm 62 can move in the plane of the substrate as shown in FIG. 16 instead of in the vertical plane as shown in the previous figures. FIG. 16 also indicates that the sacrificial layer is typically extended partially under the fixed layers. This is desirable in most structures as it keeps the movable NEMS objects from being attracted to the underlying substrate at any time during operation. This alternative is shown in part to provide an indication of the variety of structures that are possible in this technology.

Example 3

NEMS Inertial Sensor

Figure 17A:
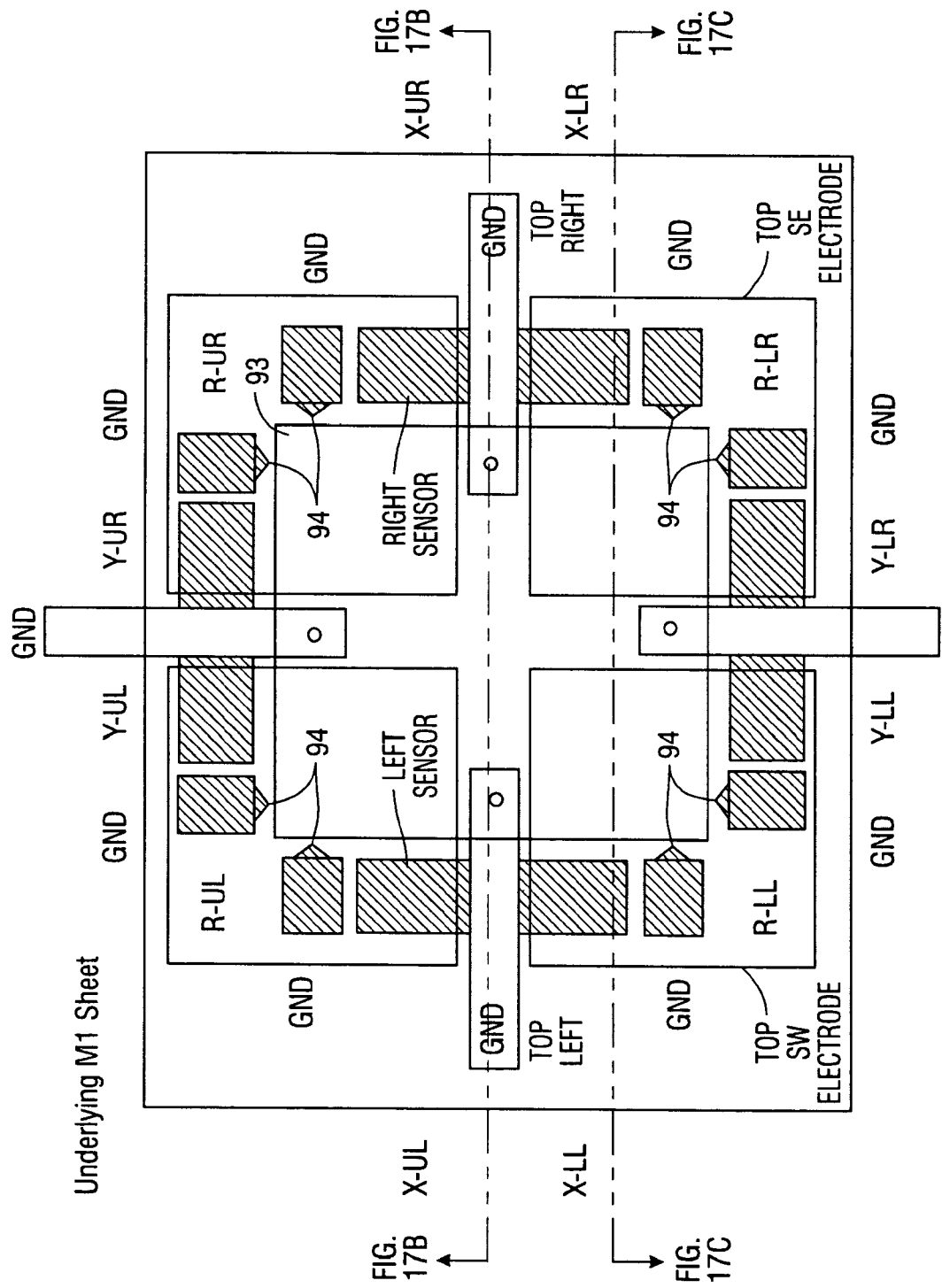

In general, the most accurate inertial sensors are ones in which force feedback on an inertial system is used to restore a proof mass to its original relative position. By carefully measuring the force applied, the acceleration in three dimensions and the rotational acceleration in three dimensions can be measured. One of the biggest limitations on the sensitivity of today's MEMS acceleration sensors is that the resonant frequency of the proof mass/spring system is quite high. That keeps these systems from achieving acceleration noise floors that are as low as millimeter scale systems. By that analogy, one might assume nanometer scale systems would be even worse. However, if we "cut" the spring, and have a mass suspended by electrostatic or magnetic force, we can create an effective resonant frequency of zero. The underlying idea is that this device uses a NEMS component that is not touching at any point during normal operation. In this application, the dimensions of a moving plate 93 shown FIG. 17A could be larger than 1 μm in X and Y dimensions. However, the gaps between metal layers are all less than 1 μm and the ideas disclosed in this document for controlling the surface adhesion forces in released NEMS objects are also needed to lower the force required to release the moving plate 93 from adhesion to three of the ground points. Note that the points 94 keep the plate 93 from moving too far laterally in any direction while the points 95 (FIG. 17B) keep the plate 93 from moving up. There are also similar points 96 below the plate 93 on separate GND fingers (also shown in FIG. 17B) that keep the plate 93 from moving downward. All of the points 94, 95, 96 are at a common potential and no matter what point the moving plate 93 touched last, the plate's potential will be set to GND by that point. This allows all of the eight actuator plates (electrodes, one above and one below in each quadrant, See FIG. 17C) to adjust their voltages to generate an electrostatic force that will float the plate 93 between all of the points 94, 95, 96 without touching any of them. In normal operation, the feedback voltages needed to keep the plate 93 from touching any of the points 94, 95, 96 will be the signal that indicates the acceleration along that axis. By applying an AC signal on the lower plates as well as the low frequency control signals, the strength of that AC signal on every other drive plate is an indication of its capacitance to the moving plate 93. These signals can be combined by the appropriate feedback control system to drive the low frequency voltages on all of the drive plates. One skilled in the art of inertial sensor design would realize that there are a large variety of electrode configurations that could be used in such a sensor. For example, instead of a single parallel plate capacitor on the four sides of the structure, comb finger arrays could be placed on all four sides to increase the change in capacitance with a change in position. This makes for a better capacitive position sensing and better actuation force for a given drive voltage. The key challenge with using a fully released object is that its position must be sensed and controlled in all six degrees of freedom simultaneously or else some portion of the released object will touch upon one of the landing points compromising the accuracy of any measurement. In addition, the use of an array of such sensors of different sizes to achieve higher dynamic range in the acceleration signals sensed is also contemplated using this device structure.

FIGS. 18A, 18B, and 18C illustrate various examples of structures before their release. The examples have various geometries and have been constructed with 50 nm thick platinum using direct-write e-beam lithography.

Figure 19:
FIG. 19 is an example of a 100 nm disk assembled (i.e., moved) horizontally to the largest fixed disk; in the figure, the small disk started out centered and moved to "adhere" to the closet fixed disk.

FIG. 19 is an example of a 100 nm diameter disk assembled horizontally to the nearest large fixed disk. The small disk started at center and then moved so as to adhere to the nearest large fixed disk.

Figure 20:
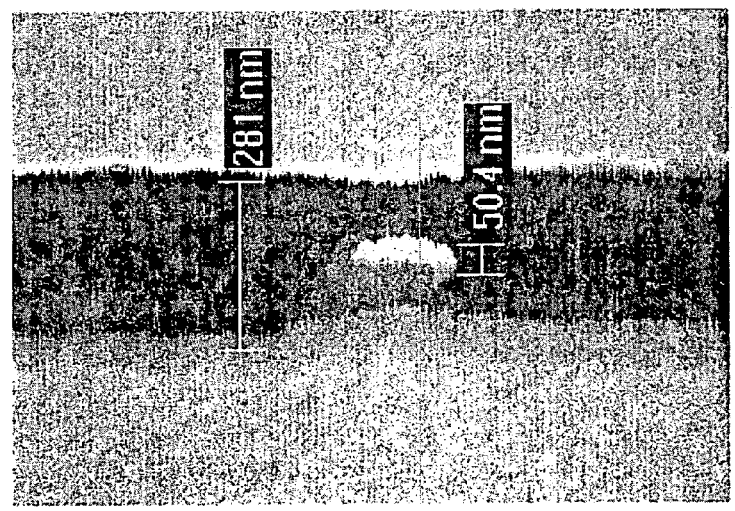
FIG. 20 is an example of a 70 nm disk assembled horizontally onto a line structure.

FIG. 20 is an example of a 70 nm diameter disk assembled horizontally to a line, but offset downwardly toward the substrate. The disk was pulled to the line to which it was nearest, but the rear edge rotated downwardly toward the substrate during assembly.

Figure 21:
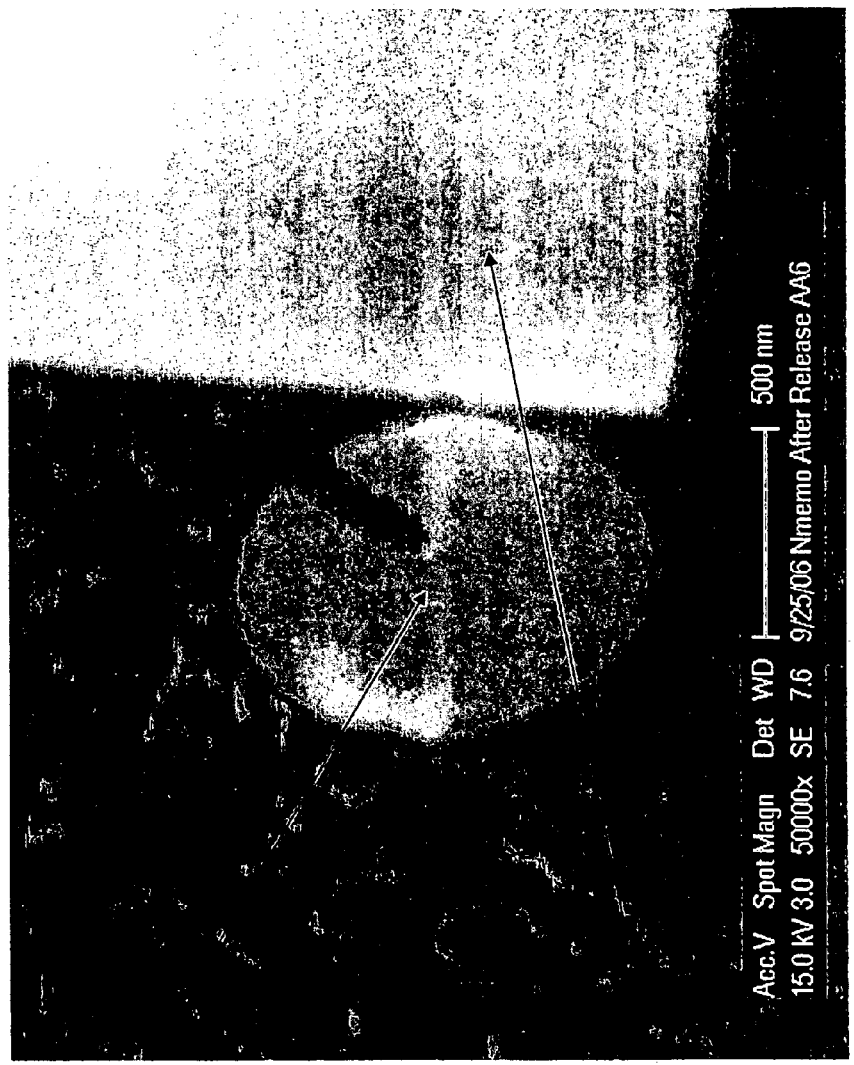
FIG. 21 is an example of a large disk assembled horizontally onto a structure.

FIG. 21 is an example of a large disk assembled horizontally to a structure. While one edge of the disk remained assembled with the fixed structure, the opposite edge of the large disk rotated downward to the substrate. It is believed that the SEM E-beam may have charged the structure and could have been responsible for the motion.

Figure 22A:
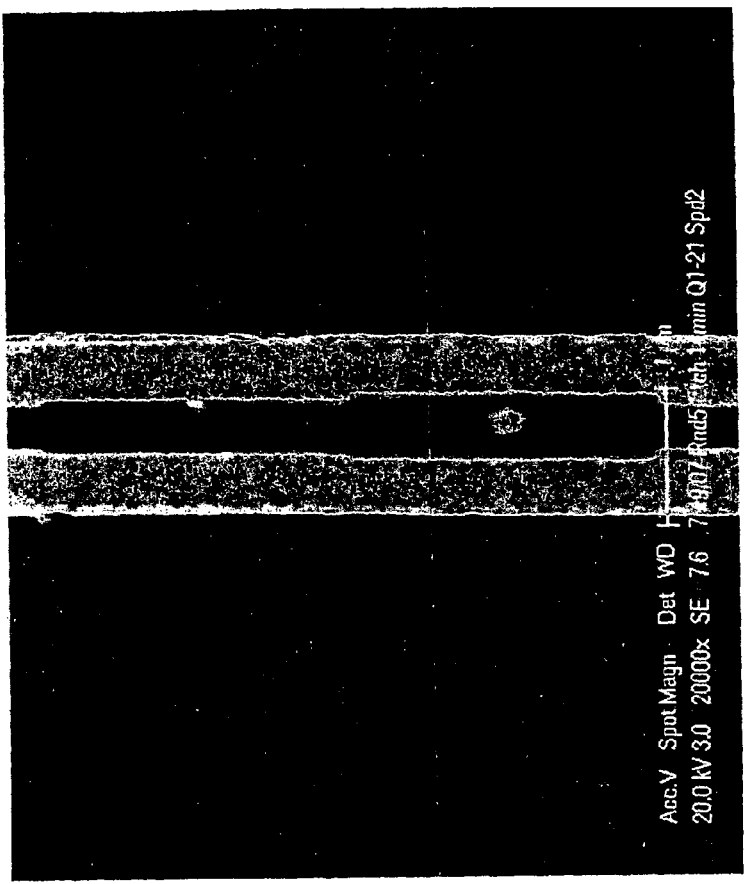
FIGS. 22A and 22B illustrate two "dots" of different sizes, the 50 nm sized structure assembled after release while the 150 nm sized structure did not release.
Figure 22B:
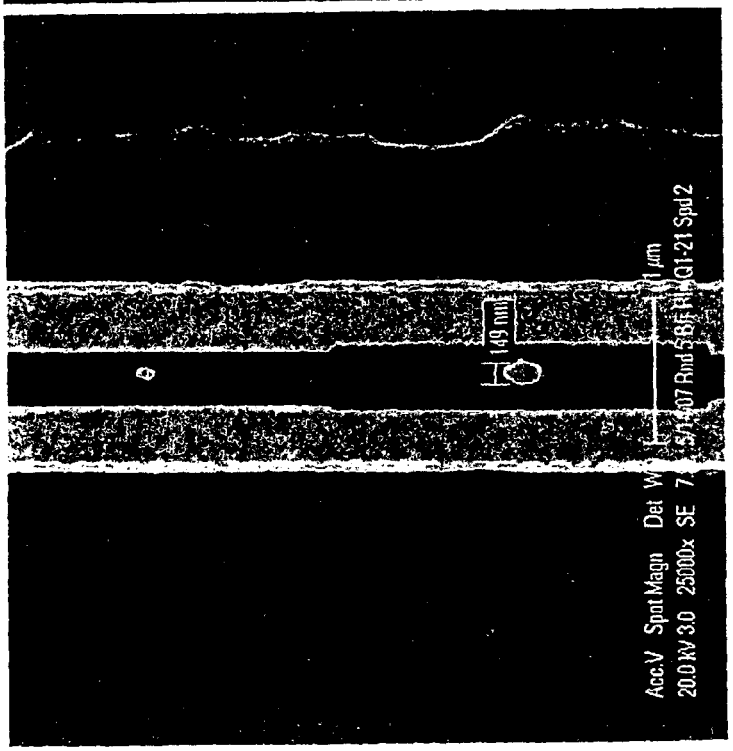

FIGS. 22A and 22B illustrate two dots of different diameters. By selecting appropriate release conditions, a high yield of assembled nano-particles can be achieved. In FIG. 22A, a 150 nm diameter structure and a 50 nm diameter structure are shown before release. In FIG. 22B, after release, it is seen that the 50 nm structure has assembled, while the 150 nm structure has not.

While the present invention has been described in conjunction with preferred embodiments, those of ordinary skill in the art will recognize that many modifications and variations are possible. The present invention is intended to be limited only by the following claims and not the foregoing description.

What is claimed is:

1. A method of constructing devices using semiconductor manufacturing processes, comprising:
fabricating a device having a movable portion and a fixed portion, said movable portion being supported by the fixed portion only through at least one sacrificial layer;
removing said sacrificial layer so as to completely release said movable portion from all supporting structure in the presence of a non-gravitational force of sufficient strength so as to controllably reposition said movable portion, wherein the non-gravitational force is present at a time of sacrificial layer removal, wherein the non-gravitational force controllably repositions the movable portion at the time of sacrificial layer removal.

2. The method of claim 1 wherein said fabricating a device includes fabricating a device that has a movable portion sized to be less than or equal to one micron in all dimensions.

3. The method of claim 1 wherein said removing said sacrificial layer in the presence of a force comprises removing said sacrificial layer in the presence of at least one of a centrifugal, centripetal, magnetic, electrostatic, van der Waals, Casimir, and inter-molecular force.

4. The method of claim 3 additionally comprising physically orienting said device to enable at least one of a centrifugal and centripetal force to reposition said movable portion.

5. The method of claim 3 additionally comprising applying at least one of a magnetic field and an electrical field to reposition said movable portion.

6. The method of claim 3 wherein said movable portion is physically positioned sufficiently close to said fixed portion to enable van der Waals, Casimir, electrostatic, and inter-molecular forces to reposition said movable portion.

7. The method of claim 1 wherein said repositioning of said movable portion comprises repositioning said movable portion to a single desired location.

8. The method of claim 1 wherein said repositioning of said movable portion comprises repositioning said movable portion to one of a plurality of desired locations.

9. The method of claim 1 wherein said removing of said sacrificial layer in the presence of a force comprises removing said sacrificial layer with a reactive ion etch in such a manner that said movable portion becomes charged with respect to said fixed portion.

10. The method of claim 9 wherein said fabricating a device comprises fabricating said fixed portion so that said fixed portion is grounded to a substrate and said movable portion is insulated from said substrate at a point during the release process.

11. The method of claim 1, wherein when completely released, the moveable portion is momentarily in a state unconnected to any solid structure.

12. The method of claim 1, further comprising:
artificially generating an electrical field or a magnetic field to controllably reposition the movable portion from an unconnected, unsupported position of the momentary unconnected state to a position in contact with the fixed portion.

13. The method of claim 1, further comprising:
fabricating an electrode juxtaposed with said movable portion to form a switch.

14. The method of claim 1, further comprising:
repeating the steps of fabricating and removing to formulate a plurality of devices that together form a memory, each device being configured to store one bit of data in the memory.

15. The method of claim 1 wherein said removing said sacrificial layer in the presence of a Casimir force.

* * * * *